United States Patent
Horiguchi et al.

(10) Patent No.: US 8,481,247 B2
(45) Date of Patent: Jul. 9, 2013

(54) RESIST UNDERLAYER FILM FORMING COMPOSITION CONTAINING LIQUID ADDITIVE

(75) Inventors: Yusuke Horiguchi, Toyama (JP); Tetsuya Shinjo, Toyama (JP); Satoshi Takei, Toyama (JP)

(73) Assignee: Nissan Chemical Industries, Ltd., Chiyoda-Ku, Tokyo ( * ) Notice: Subject to any disclaimer, the term of this patent is extended or adjusted under 35 U.S.C. 154(b) by 0 days.

(21) Appl. No.: 12/310,328

(22) PCT Filed: Aug. 20, 2007

(86) PCT No.: PCT/JP2007/066122
§ 371 (c)(1),
(2), (4) Date: Feb. 20, 2009

(87) PCT Pub. No.: WO2008/026468
PCT Pub. Date: Mar. 6, 2008

(65) Prior Publication Data
US 2009/0311624 A1    Dec. 17, 2009

(30) Foreign Application Priority Data

Aug. 28, 2006 (JP) ................. 2006-230853

(51) Int. Cl.
| | |
|---|---|
| G03F 7/11 | (2006.01) |
| G03F 7/20 | (2006.01) |
| G03F 7/004 | (2006.01) |
| C08L 71/00 | (2006.01) |
| C09D 5/32 | (2006.01) |
| H01L 21/027 | (2006.01) |

(52) U.S. Cl.
USPC ........ 430/319; 430/271.1; 430/325; 430/326; 430/330; 430/311; 525/430; 525/496

(58) Field of Classification Search
None
See application file for complete search history.

(56) References Cited

U.S. PATENT DOCUMENTS

| | | | | |
|---|---|---|---|---|
| 4,442,258 A | * | 4/1984 | Sunakawa et al. | 524/767 |
| 4,882,245 A | * | 11/1989 | Gelorme et al. | 430/14 |
| 4,937,173 A | * | 6/1990 | Kanda et al. | 430/281.1 |
| 5,693,691 A | | 12/1997 | Flaim et al. | |

(Continued)

FOREIGN PATENT DOCUMENTS

| | | | |
|---|---|---|---|
| JP | 04-301802 A | * | 10/1992 |
| JP | A-2000-294504 | | 10/2000 |

(Continued)

OTHER PUBLICATIONS

Define: calcination, as downloaded on Aug. 31, 2010 from http://www.google.com, two pages from Google search.*

(Continued)

*Primary Examiner* — Cynthia Hamilton
(74) *Attorney, Agent, or Firm* — Oliff & Berridge, PLC

(57) ABSTRACT

To provide a resist underlayer film forming composition for lithography that is used in a lithography process for production of a semiconductor device. There is provided a resist underlayer film forming composition used in a lithography process for production of a semiconductor device, comprising a resin (A), a liquid additive (B) and a solvent (C). The liquid additive (B) may be an aliphatic polyether compound. The liquid additive (B) may be a polyether polyol, polyglycidyl ether or a combination thereof. Further, there is provided a method of manufacturing a semiconductor device, including the steps of forming a resist underlayer film by applying the resist underlayer film forming composition on a semiconductor substrate and by calcining the composition; forming a photoresist layer on the underlayer film; exposing the semiconductor substrate coated with the resist underlayer film and the photoresist layer to light; and developing the photoresist layer after the exposure to light.

5 Claims, 1 Drawing Sheet

U.S. PATENT DOCUMENTS

| | | | |
|---|---|---|---|
| 5,728,770 | A * | 3/1998 | Yamamoto et al. ............ 524/755 |
| 5,919,599 | A | 7/1999 | Meador et al. |
| 6,030,741 | A * | 2/2000 | Doi et al. ....................... 430/191 |
| 6,323,310 | B1 | 11/2001 | Puligadda et al. |
| 6,444,320 | B1 * | 9/2002 | Takei et al. .................... 428/413 |
| 6,492,092 | B1 | 12/2002 | Foster et al. |
| 6,627,364 | B2 * | 9/2003 | Kiguchi et al. ................... 430/7 |
| 6,709,096 | B1 * | 3/2004 | Beach et al. .................... 347/103 |
| 6,790,568 | B2 * | 9/2004 | Goto ................................. 430/7 |
| 2001/0046562 | A1 * | 11/2001 | Whitefield et al. ......... 427/372.2 |
| 2002/0132872 | A1 * | 9/2002 | Yamamura et al. .............. 522/15 |
| 2003/0146416 | A1 * | 8/2003 | Takei et al. .................... 252/500 |
| 2003/0157248 | A1 * | 8/2003 | Watkins et al. ................ 427/256 |
| 2003/0175615 | A1 * | 9/2003 | Miyake et al. ............. 430/270.1 |
| 2005/0074695 | A1 * | 4/2005 | Nakamura et al. ......... 430/271.1 |
| 2006/0141400 | A1 * | 6/2006 | Hirayama et al. ............. 430/395 |
| 2008/0102649 | A1 * | 5/2008 | Takei et al. .................... 438/781 |
| 2008/0290314 | A1 * | 11/2008 | Lee et al. ................. 252/62.3 V |

FOREIGN PATENT DOCUMENTS

| | | |
|---|---|---|
| JP | A-2002-47430 | 2/2002 |
| JP | A-2002-128847 | 5/2002 |
| JP | A-2002-190519 | 7/2002 |
| JP | A-2002-539282 | 11/2002 |
| WO | WO 00/53645 A1 | 9/2000 |
| WO | WO 02/05035 A1 | 1/2002 |
| WO | WO 2005/111724 A1 | 11/2005 |
| WO | WO 2006/077748 A1 * | 7/2006 |

OTHER PUBLICATIONS

"calcination", Academic Press Dictionary of Science and Techology, one page ( dated 1992) retreived from http://www.credoreference.com/entry/apdst/calcination.*

Yamada et al , Macromolecules, vol. 37, year 2004, pp. 377-384. published on we Dec. 24, 2003.*

1,4-Bis((2,3-epoxypropoxy)methyl)cyclohexane|14228-73-0(Chemical Book) Copyright 2010 © ChemicalBook. All rights reserved 2 pages downloaded from http://www.chemicalbook.com/ChemicalProductProperty_EN_CB6138682.htm on Feb. 26, 2011.*

Britt et al, Prepr.Pap.-Am. Chem. Soc., Div. Fuel Chem 2003, 48 (2),p. 563-4.*

TRIPROPYLENE GLYCOL , downloaded from http://www.chemicalland21.com/industrialchem/solalc/TRIPROPYLENE%20GLYCOL.htm on Mar. 23, 2012, 2 pages. from CHEMICALLAND21.*

"triethylene glycol" Lewis, Richard J., Sr. (2007). Hawley's Condensed Chemical Dictionary (15th Edition), John Wiley & Sons, p. 1272.*

CAS Registry No. 3126-63-4, Scifinder database downloaded Nov. 26, 2012 From Scifinder database copyright America Chemical Society 2012, 4 pages.*

Tom Lynch et al., "Properties and Performance of Near UV Reflectivity Control Layers", Proceedings of SPIE, 1994, p. 225-235, vol. 2195.

G. Taylor et al., "Methacrylate Resists and Antireflective Coatings for 193 nm Lithography", Proceedings of SPIE, 1999, p. 174-185, vol. 3678.

Jim Meador et al., "Recent Progress in 193 nm Antireflective Coatings", Proceedings of SPIE, 1999, p. 100-109, vol. 3678.

Yoshinori Nakane et al., Radical Polymerization of 1-Butoxyethyl Methacrylate and Thermal Decomposition of the Obtained Polymer, Journal of the Adhesion Society of Japan, 1998, p. 352-356, vol. 34, No. 9.

* cited by examiner

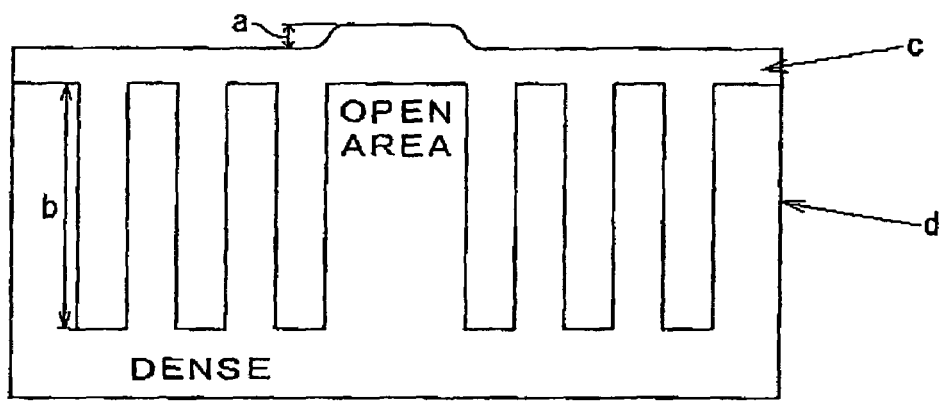

RESIST UNDERLAYER FILM FORMING COMPOSITION CONTAINING LIQUID ADDITIVE

TECHNICAL FIELD

The present invention relates to a novel resist underlayer film forming composition for lithography, an underlayer film formed with the composition, and a method of forming a photoresist pattern using the underlayer film. In addition, the present invention relates to: a resist underlayer film for lithography capable of being used in a lithography process for the production of semiconductor devices as an underlayer reflection preventing film for reducing the reflection of exposure irradiation light on a semiconductor substrate toward a photoresist layer applied on the substrate, as a planarizing film for planarizing a semiconductor substrate having unevenness, and as a film for preventing contamination of a photoresist layer due to substances generated at a semiconductor substrate during heating and calcining or the like; and also relates to a resist underlayer film forming composition for forming the underlayer film and a method of forming the underlayer film. Further, the present invention relates to a resist underlayer film forming composition for lithography capable of being used for filling a hole formed on a semiconductor substrate.

BACKGROUND ART

Conventionally in the production of a semiconductor device, fine processing by the lithography using a photoresist has been performed. The fine processing is a processing method for forming fine convexoconcave corresponding to the following pattern on the surface of a substrate by forming a thin film of a photoresist on a semiconductor substrate, such as silicon wafer; irradiating an activating light ray, such as an ultra violet ray onto the resultant thin film through a mask pattern in which a pattern of a semiconductor device is depicted for development; and subjecting the substrate to etching processing using the resultant photoresist pattern as a protecting film. Recently, however, the high integration of semiconductor devices is progressed and the adopted activating light ray tends to have a shorter wavelength, such as from a KrF excimer laser (248 nm) to an ArF excimer laser (193 nm). Following such a tendency, the influence of diffuse reflection of an activating light ray on the substrate or of a standing wave has become a large problem. Thus, in order to solve this problem, widely studied is a method of providing a reflection preventing film (bottom anti-reflective coating, BARC) between the photoresist and the substrate. For such a reflection preventing film, many investigations on an organic reflection preventing film composed of absorptive substances, polymer compounds, and the like are performed in terms of easiness of its use, and examples thereof include: both an acrylic resin-based reflection preventing film having a hydroxyl group which is a crosslinkable group and a light absorbing group within one molecule thereof; and a novolac resin-based reflection preventing film having both a hydroxyl group which is a crosslinkable group and a light absorbing group within one molecule thereof (for example, see Patent Document 1 and Patent Document 2).

As a characteristic required for the organic reflection preventing film, there can be mentioned having a large absorbance to light or radiation, no-intermixing with a photoresist layer (being insoluble in a photoresist solvent), no-occurring the diffusion of low molecule substances from the reflection preventing film to the photoresist of an upper layer during heating and calcining, having a larger dry etching rate than that of the photoresist, and the like (for example, see Non-patent Document 1, Non-patent Document 2 and Non-patent Document 3).

Further, recently, for solving a problem of the wiring delay which has become apparent as the miniaturization of a pattern rule of the semiconductor device has progressed, it is studied to use copper as a wiring material. Then, together with it, a dual damascene process is studied as a wiring forming method for the semiconductor substrate. Then, in the dual damascene process, a via hole is formed and a reflection preventing film is formed to a substrate having a large aspect ratio. Therefore, for the reflection preventing film used in this process, filling characteristics capable of filling holes without voids, planarization characteristics capable of forming a planar film on the substrate surface, and the like are required.

However, it is difficult to apply an organic material for a reflection preventing film to a substrate having a large aspect ratio and recently, materials focusing on the filling characteristics and the planarization characteristics have been developed (for example, see Patent Document 3, Patent Document 4, Patent Document 5 and Patent Document 6).

In addition, in the production of devices such as semiconductor, for reducing the poisoning effect of a photoresist layer by a dielectric layer, there is disclosed a method for providing a barrier layer formed from a composition containing crosslinkable polymers or the like between the dielectric layer and the photoresist layer (for example, Patent Document 7).

Disclosed is a resist underlayer film forming composition containing a plasticizer such as dibasic ester used in the production of semiconductor devices (for example, see Patent Document 8).

Thus, in the production of semiconductor devices in recent years, for achieving various effects besides the reflection preventing effect, as a layer between the semiconductor substrate and the photoresist layer, that is, as an underlayer of the photoresist layer, an organic underlayer film formed from a composition containing organic compounds has become disposed.

Since it is required for the underlayer film not to intermixing, a crosslinking reaction is frequently utilized for forming the underlayer film. Then, as a composition for forming such a crosslinkable underlayer film, a composition containing polymers, c a cross linker and a sulfonic acid compound as a crosslinking catalyst is used (for example, see Patent Document 1, Patent Document 3, Patent Document 4 and Patent Document 6). However, since the composition contains such a strong acid as a sulfonic acid compound, it is considered that the composition has a problem in the storage stability.

Therefore, an underlayer film formed by utilizing a crosslinking reaction requiring no strong acid catalyst and a composition therefor have been desired.

[Patent Document 1]
U.S. Pat. No. 5,919,599 Specification
[Patent Document 2]
U.S. Pat. No. 5,693,691 Specification
[Patent Document 3]
Japanese Patent Application Publication No. JP-A-2000-294504
[Patent Document 4]
Japanese Patent Application Publication No. JP-A-2002-47430
[Patent Document 5]
Japanese Patent Application Publication No. JP-A-2002-190519

[Patent Document 6]
International Publication No. WO 02/05035 pamphlet
[Patent Document 7]
Japanese Patent Application Publication No. JP-A-2002-128847
[Patent Document 8]
Japanese Patent Application Publication No. JP-A-2002-47430
[Non-patent Document 1]
Tom Lynch et al (3 persons) "Properties and Performance of Near UV Reflectivity Control layers" U.S.A., in Advances in Resist Technology and Processing XI, edited by Omkaram Nalamasu, Proceedings of SPIE, 1994, Vol. 2195, p. 225-229
[Non-patent Document 2]
G. Taylor et al (13 persons) "Methacrylate Resist and Antireflective Coatings for 193 nm Lithography" U.S.A., in Microlithography 1999: Advances in Resist Technology and Processing XVI, edited by Will Conley, Proceedings of SPIE, 1999, Vol. 3678, p. 174-185
[Non-patent Document 3]
Jim D. Meador et al (6 persons) "Recent Progress in 193 nm Antireflective Coatings" U.S.A., in Microlithography 1999: Advances in Resist Technology and Processing XVI, edited by Will Conley, Proceedings of SPIE, 1999, Vol. 3678, p. 800-809

DISCLOSURE OF THE INVENTION

Problems to be Solved by the Invention

It is an object of the present invention to provide a resist underlayer film forming composition capable of being used in the production of semiconductor devices and also to provide: a resist underlayer film for lithography not to intermix with a photoresist layer applied and formed as an upper layer thereof and to have a larger dry etching rate than that of the photoresist layer; and a resist underlayer film forming composition for forming the underlayer film. In addition, another object of the present invention is to provide: a resist underlayer film formed by utilizing a crosslinking reaction requiring no strong acid catalyst; a method of forming the underlayer film; and a resist underlayer film forming composition therefor.

Further, still another object of the present invention is to provide: a resist underlayer film for lithography capable of being used in a lithography process for the production of semiconductor devices as an underlayer reflection preventing film for reducing the reflection of exposure irradiation light on a semiconductor substrate toward a photoresist layer formed on the substrate, as a planarizing film for planarizing a semiconductor substrate having unevenness, as a film for preventing contamination of a photoresist layer due to substances generated at a semiconductor substrate during heating and calcining or the like; and a resist underlayer film forming composition for forming a resist underlayer film. Then, still another object of the present invention is to provide a method of forming a resist underlayer film for lithography using the resist underlayer film forming composition and a method of forming a photoresist pattern.

Means for Solving the Problems

The present invention provides, according to a first aspect, a resist underlayer film forming composition used in a lithography process for production of a semiconductor device containing a resin (A), a liquid additive (B), and a solvent (C);

according to a second aspect, in the resist underlayer film forming composition according to the first aspect, the liquid additive (B) is an aliphatic polyether compound;

according to a third aspect, in the resist underlayer film forming composition according to the first aspect, the liquid additive (B) is a polyether polyol, a polyglycidyl ether or a combination thereof;

according to a fourth aspect, in the resist underlayer film forming composition according to the third aspect, the polyether polyol is a compound represented by Formula (1):

[Chemical Formula 1]

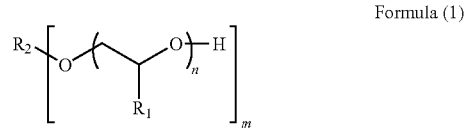

Formula (1)

(where n represents an integer of 1 to 300; m represents an integer of 2 to 6; $R_1$ represents a hydrogen atom or an alkyl group having 1 to 10 carbon atom(s); and $R_2$ represents an alkyl group having 1 to 10 carbon atom(s), an alkenyl group having 2 to 6 carbon atoms, an alkynyl group having 2 to 10 carbon atoms, an alkylcarbonyl group having 2 to 10 carbon atoms, an alkylcarbonylamino group having 2 to 10 carbon atoms, an alkyloxyalkyl group having 2 to 10 carbon atoms, an alkylamino group having 1 to 10 carbon atom(s), an alkyldiamino group having 1 to 10 carbon atom(s) or a combination thereof and is an organic group capable of having a valence number of 2 to 6 according to the number m of polyoxyalkylene groups);

according to a fifth aspect, in the resist underlayer film forming composition according to the third aspect, the polyglycidyl ether is a compound represented by Formula (2):

[Chemical Formula 2]

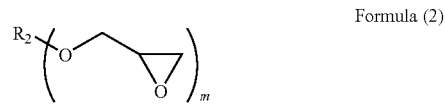

Formula (2)

(where m represents an integer of 2 to 6; $R_2$ represents the same as defined in Formula (1) and is an organic group capable of having a valence number of 2 to 6 according to the number m of glycidyl ether groups);

according to a sixth aspect, the resist underlayer film forming composition according to any one of the first aspect to the fifth aspect, further containing a light absorbing compound (D);

according to a seventh aspect, a method of forming a resist underlayer film used in a lithography process for production of a semiconductor device including applying the resist underlayer film forming composition according to any one of the first aspect to the sixth aspect on a substrate and calcining the composition; and according to an eighth aspect, a method of manufacturing a semiconductor device including: forming a resist underlayer film by applying the resist underlayer film forming composition according to any one of the first aspect to the sixth aspect on a semiconductor substrate and by calcining the composition, forming a photoresist layer on the underlayer film, exposing the semiconductor substrate coated with the resist underlayer film and the photoresist layer to light, and developing the photoresist layer after the exposure to light.

Effects of the Invention

The present invention is related to a resist underlayer film formed by utilizing a crosslinking reaction requiring no strong acid catalyst and to a resist underlayer film forming composition for forming the resist underlayer film.

Since the resist underlayer film forming composition of the present invention contains no strong acid catalyst component, it is excellent in storage stability.

Since a system in which the resist underlayer film forming composition of the present invention forms a crosslinked structure through a reaction between polymers or between polymers and additives, contains no low molecule compound which has been conventionally frequently used such as low molecule crosslinkers and sulfonic acid compounds, the amount of sublimates generated during the calcination can be reduced and the contamination of a semiconductor substrate or a clean room by particles or foreign matters derived from the sublimate can be avoided.

By the resist underlayer film forming composition of the present invention, high filling properly inside the hole can be achieved without causing a void (gap). In addition, since convexoconcave of a substrate having holes can be filled and planarized, the uniformity of the film thickness of a photoresist etc. applied and formed on the substrate can be enhanced. Therefore, also in a process using a substrate having holes, an advantageous photoresist pattern form can be formed.

By the resist underlayer film forming composition of the present invention, an excellent resist underlayer film having a larger dry etching rate than that of a photoresist and further causing no intermixing with a photoresist, can be provided.

In addition, the resist underlayer film of the present invention can be used as a reflection preventing film, a planarizing film, contamination preventing film for the photoresist layer, and the like. By this resist underlayer film, the forming of a photoresist pattern in a lithography process for the production of a semiconductor device can be performed easily and with high accuracy.

After the resist underlayer film forming composition is applied to a semiconductor substrate having unevenness and a solvent is evaporated, the resist underlayer film is formed. In a conventional resist underlayer film forming composition, a resist underlayer film is filled in a hole in the beginning of the solvent evaporation, so that it is difficult to fully planarize the substrate. However, since the resist underlayer film forming composition of the present invention contains a liquid additive, even in the beginning of the solvent evaporation, the composition has fluidity and the reflow properties thereof during heating can be enhanced. Therefore, the hole can be fully filled and the planarizing properties can be enhanced.

In addition, even when the resist underlayer film forming composition containing a liquid additive according to the present invention is filled in the hole during the applying the composition, a void caused due to the removal of a solvent by heating thereafter is not caused. This is because, even when the solvent is removed by heating, the liquid additive secures the fluidity of the resist underlayer film forming composition and the reflow properties are enhanced, so that the void (gap) is filled and by the reflow properties, the planarizing properties of the surface of the resist underlayer film is enhanced.

As this liquid additive has a hydroxy group or an epoxy group in the molecule thereof, the liquid additive generates a crosslinking bond with a resin component easily and it can be polymerized. After the resultant polymer is filled in the hole, the polymer becomes fully solidified. Thus, by containing the liquid additive in the resist underlayer film forming composition, in the process in which the composition is applied to a semiconductor substrate having unevenness, is filled in the hole and thereafter is solidified, the composition is fully filled in the hole, so that a surface having high planarizing properties is formed.

BEST MODES FOR CARRYING OUT THE INVENTION

The present invention is a resist underlayer film forming composition used in a lithography process for the production of a semiconductor device containing a resin (A), a liquid additive (B) and a solvent (C).

Though the ratio of the solid content in the resist underlayer film forming composition of the present invention is not particularly limited so long as each component is homogeneously dissolved, it is, for example, 0.1 to 70% by mass, or 0.5 to 50% by mass, or 1 to 30% by mass. Here, the solid content means a content of the remained components after removing a solvent component from all components of the resist underlayer film forming composition. Then, the ratio of the resin (A) in the solid content is 70% by mass or more, for example, 80 to 100% by mass, or 80 to 99% by mass, or 90 to 99% by mass.

As the resin (A) used in the present invention, any resin can be used.

Preferably, the resin (A) can contain a compound having a protected carboxyl group and a compound having a group reactable with a carboxyl group. In addition, as the resin (A), a compound having a protected carboxyl group and a group reactable with a carboxyl group can be used.

The resin (A) used in the present invention contains a compound having a protected carboxyl group represented by Formula (3):

[Chemical Formula 3]

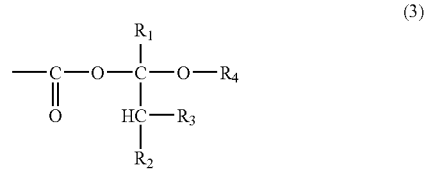

(3)

(where $R_1$, $R_2$ and $R_3$ individually represent a hydrogen atom or an alkyl group having 1 to 10 carbon atom(s); $R_4$ represents an alkyl group having 1 to 10 carbon atom(s); and also $R_3$ and $R_4$ may be bonded to each other to form a ring), and a compound having a group reactable with a carboxyl group.

In addition, the resin (A) used in the present invention contains a compound having a group reactable with a carboxyl group and a protected carboxyl group represented by Formula (3).

The group reactable with the carboxyl group is a group selected from a group consisting of an epoxy group, an oxetanyl group, an oxazoline group, a cyclocarbonate group, an alkoxysilyl group, an aminomethylol group, an aziridinyl group, a methylol group, a hydroxyl group, an isocyanate group, an alkoxymethylamino group and a hydroxysilyl group.

The compound having a protected carboxyl group represented by Formula (3) is preferably a polymer containing a unit structure represented by Formula (4):

[Chemical Formula 4]

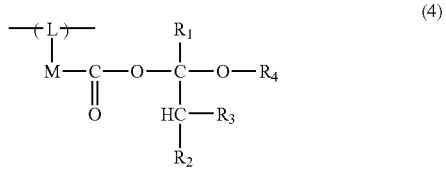
(4)

(where L represents a ligand constituting a main chain of the polymer, and M represents a direct bonding or a linking group).

The compound having a protected carboxyl group represented by Formula (3) is preferably a compound having at least two protected carboxyl groups represented by Formula (3) and having a molecular mass of 200 to 2,000.

The compound having a group reactable with the carboxyl group is a compound having at least two groups represented by Formula (5):

[Chemical Formula 5]

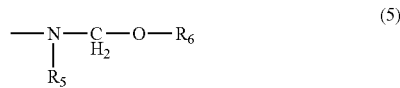
(5)

(where $R_5$ represents a hydrogen atom, an alkyl group having 1 to 6 carbon atom(s) or —$CH_2OR_7$ (where $R_7$ represents a hydrogen atom or an alkyl group having 1 to 10 carbon atom(s)); and $R_6$ represents a hydrogen atom or an alkyl group having 1 to 10 carbon atom(s)).

Further, the compound having a group reactable with the carboxyl group is a polymer containing at least one type of unit structure selected from a group consisting of unit structures represented by Formula (6), Formula (7), Formula (8), Formula (9), Formula (10), and Formula (11):

[Chemical Formula 6]

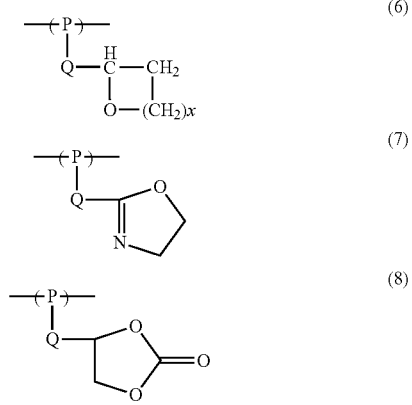
(6)

(7)

(8)

(9)

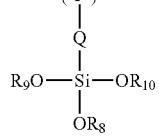

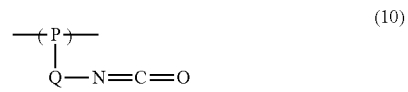
(10)

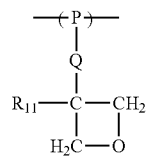
(11)

(where P represents a ligand constituting a main chain of the polymer; Q represents a direct bonding or a linking group; $R_8$, $R_9$, $R_{10}$ and $R_{11}$ individually represent a hydrogen atom or an alkyl group having 1 to 6 carbon atom(s); and x represents 0 or 1).

Then, the compound having a group reactable with the carboxyl group and a protected carboxyl group represented by Formula (3) is preferably a polymer containing a unit structure represented by Formula (4) and at least one type of unit structure selected from a group consisting of unit structures represented by Formula (6), Formula (7), Formula (8), Formula (9), Formula (10) and Formula (11).

In Formula (3), $R_1$, $R_2$ and $R_3$ individually represent a hydrogen atom or an alkyl group having 1 to 10 carbon atom(s); $R_4$ represents an alkyl group having 1 to 10 carbon atom(s); and also $R_3$ and $R_4$ may be bonded to each other to form a ring. Examples of the alkyl group having 1 to 10 carbon atom(s) include a methyl group, an ethyl group, an n-butyl group, an n-octyl group, an isopropyl group, a tert-butyl group, a 2-ethylhexyl group and a cyclohexyl group. In addition, $R_3$ and $R_4$ may be bonded to each other to form a ring and examples of the thus formed ring include a tetrahydrofuran ring and a tetrahydropyran ring.

The compound having a protected carboxyl group represented by Formula (3) can be produced by reacting a compound having a carboxyl group with a vinyl ether compound represented by Formula (12):

[Chemical Formula 7]

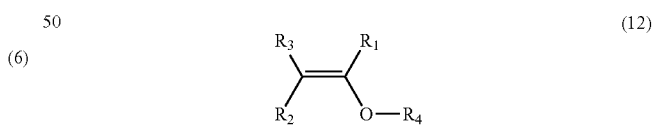
(12)

The reaction between the compound having a carboxyl group and the vinyl ether compound can be performed, for example, as described in "Journal of the Adhesion Society of Japan, Vol. 34, pp. 352 to 356", by using phosphoric acid as a catalyst and by stirring at room temperature.

Examples of the vinyl ether compound represented by Formula (12) include aliphatic vinyl ether compounds such as methyl vinyl ether, ethyl vinyl ether, isopropyl vinyl ether, n-butyl vinyl ether, 2-ethylhexyl vinyl ether, tert-butyl vinyl ether and cyclohexyl vinyl ether, and cyclic vinyl ether compounds such as 2,3-dihydrofuran, 4-methyl-2,3-dihydrofuran and 2,3-dihydro-4H-pyran.

The compound having a carboxyl group to be reacted with the vinyl ether compound represented by Formula (12) is not particularly limited so log as the compound has a carboxyl group.

Examples of the compound having a carboxyl group include benzoic acid, isophthalic acid, terephthalic acid, pyromellitic acid, 1,2,4-trimellitic acid, adipic acid, maleic acid, butane tetracarboxylic acid, tris(2-carboxyethyl) isocyanurate, naphthalene-2-carboxylic acid, naphthalene-2,6-dicarboxylic acid, pamoic acid, pyrene-1-carboxylic acid, 1,6-dibromo-2-hydroxynaphthalene-3-carboxylic acid, 1,1'-binaphthalene-2,2'-dicarboxylic acid, anthracene-9-carboxylic acid, anthracene-9,10-dicarboxylic acid, acrylic acid, methacrylic acid, maleic acid, itaconic acid, glutaric acid, 1,2-cyclohexane-dicarboxylic acid and 1,2,3,4-cyclopentane tetracarboxylic acid. The compound having a protected carboxyl group represented by Formula (3) produced from these compounds preferably has a molecular mass of 200 or more. When the molecular mass is less than this value, there may be caused such a problem that sublimation is caused during the calcination for forming the resist underlayer film. The molecular mass is, for example, 200 to 2,000, or for example, 400 to 2000. Further, the compound having a protected carboxyl group represented by Formula (3) has preferably, from the viewpoint of forming a strong resist underlayer film, two or more protected carboxyl groups represented by Formula (3) which are reaction sites during forming the underlayer film.

As the compound having a carboxyl group to be reacted with the vinyl ether compound represented by Formula (12), there can also be mentioned polymers having a carboxyl group. Such polymers are not particularly limited, however, examples thereof include polymers containing as a unit structure, an addition polymerizable monomer having a carboxyl group such as acrylic acid, methacrylic acid, vinyl benzoic acid and maleic acid.

In the present invention, as the compound having a protected carboxyl group represented by Formula (3), there can also be mentioned polymers containing a unit structure represented by Formula (4). In the formula, L represents a ligand constituting a main chain of the polymer, and M represents a direct bonding or a linking group. L is not particularly limited so long as it is a ligand constituting a main chain of the polymer. Examples of M can include linking groups containing at least one linking group selected from a phenylene group, —C(=O)—, —CH$_2$—, —NH— and —O—, or direct bonding.

Examples of the unit structure represented by Formula (4) include structures represented by Formulae [1-1] to [1-5]:

[Chemical Formula 8]

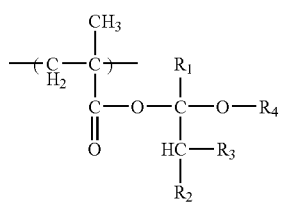
[1-1]

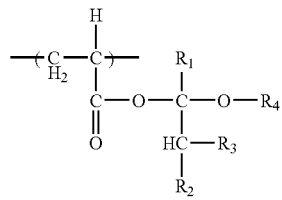
[1-2]

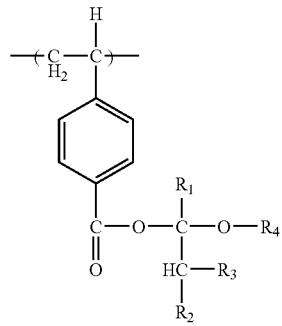
[1-3]

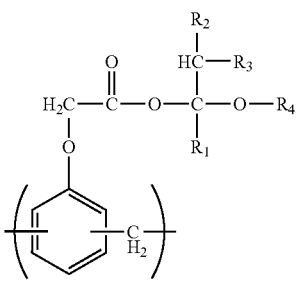
[1-4]

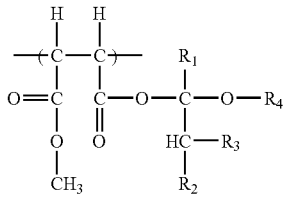
[1-5]

The polymer containing a unit structure represented by Formula (4) can be produced by reacting the polymer having a carboxyl group and the vinyl ether compound represented by Formula (12).

In addition, the addition polymerizable monomer having a protected carboxyl group represented by Formula (3) can be produced by a used polymerization reaction. Examples of such an addition polymerizable monomer include: methacrylic hemiacetal ester compounds such as 1-methoxyethyl methacrylate, 1-ethoxyethyl methacrylate, 1-isopropoxyethyl methacrylate, 1-n-hexyloxyethyl methacrylate and tetrahydro-2H-pyran-2-yl-methacrylate; acrylic hemiacetal ester compounds such as 1-methoxyethyl acrylate, 1-tert-butoxyethyl acrylate, 1-isopropoxyethyl acrylate, 1-n-butoxyethyl acrylate and tetrahydro-2H-pyran-2-yl-acrylate; 1-ethoxyethyl-4-vinylbenzoate; bis(1-ethoxyethyl)maleate; and methyl (1-ethoxyethyl)maleate.

For the production of the polymer containing a unit structure represented by Formula (4), sometimes only one type of the above addition polymerizable monomer is used and sometimes two or more types of the addition polymerizable monomers are used in combination.

In addition, for the production of the polymer containing a unit structure represented by Formula (4), besides the addition polymerizable monomer having a protected carboxyl group represented by Formula (3), other addition polymerizable monomers can be used in combination. Examples of such an addition polymerizable monomer include acrylic ester compounds, methacrylic ester compounds, acrylamide compounds, methacrylamide compounds, vinyl compounds, styrene compounds, maleimide compounds, maleic anhydride compounds and acrylonitrile.

Examples of the acrylic ester compound include methyl acrylate, ethyl acrylate, isopropyl acrylate, benzyl acrylate, naphthyl acrylate, anthryl acrylate, anthrylmethyl acrylate, phenyl acrylate, 2-hydroxyethyl acrylate, 2-hydroxypropyl acrylate, 2,2,2-trifluoroethyl acrylate, 4-hydroxybutyl acrylate, isobutyl acrylate, tert-butyl acrylate, cyclohexyl acrylate, isobornyl acrylate, 2-methoxyethyl acrylate, methoxytriethylene glycol acrylate, 2-ethoxyethyl acrylate, tetrahydrofurfuryl acrylate, 3-methoxybutyl acrylate, 2-methyl-2-adamantyl acrylate, 2-ethyl-2-adamantyl acrylate, 2-propyl-2-adamantyl acrylate, 2-methoxybutyl-2-adamantyl acrylate, 8-methyl-8-tricyclodecyl acrylate, 8-ethyl-8-tricyclodecyl acrylate and 5-acryloyloxy-6-hydroxynorbornene-2-carboxylic-6-lactone.

Examples of the methacrylic ester compound include ethyl methacrylate, n-propyl methacrylate, n-pentyl methacrylate, cyclohexyl methacrylate, benzyl methacrylate, naphthyl methacrylate, anthryl methacrylate, anthrylmethyl methacrylate, phenyl methacrylate, 2-phenylethyl methacrylate, 2-hydroxyethyl methacrylate, 2-hydroxypropyl methacrylate, 2,2,2-trifluoroethyl methacrylate, 2,2,2-trichloroethyl methacrylate, methyl acrylate, isobutyl methacrylate, 2-ethylhexyl methacrylate, isodecyl methacrylate, n-lauryl methacrylate, n-stearyl methacrylate, methoxydiethylene glycol methacrylate, methoxypolyethylene glycol methacrylate, tetrahydrofurfuryl methacrylate, isobornyl methacrylate, tert-butyl methacrylate, isostearyl methacrylate, n-butoxyethyl methacrylate, 3-chloro-2-hydroxypropyl methacrylate, 2-methyl-2-adamantyl methacrylate, 2-ethyl-2-adamantyl methacrylate, 2-propyl-2-adamantyl methacrylate, 2-methoxybutyl-2-adamantyl methacrylate, 8-methyl-8-tricyclodecyl methacrylate, 8-ethyl-8-tricyclodecyl methacrylate, 5-methacryloyloxy-6-hydroxynorbornene-2-carboxylic-6-lactone and 2,2,3,3,4,4,4-heptafluorobutyl methacrylate.

Further, examples of the acrylic ester compound and the methacrylic ester compound include compounds represented by the following Formulae [1-6] to [1-8]:

[Chemical Formula 9]

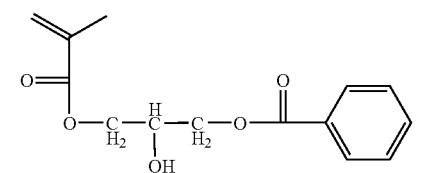

[1-6]

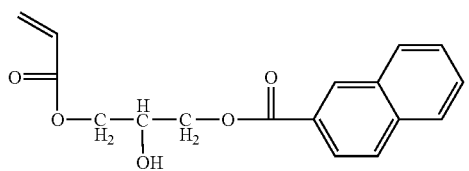

[1-7]

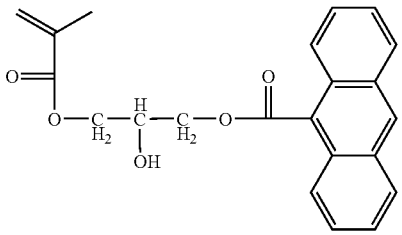

[1-8]

Examples of the acrylamide compound include acrylamide, N-methyl acrylamide, N-ethyl acrylamide, N-benzyl acrylamide, N-phenyl acrylamide and N,N-dimethyl acrylamide.

Examples of the methacrylic acid amide include methacrylamide, N-methyl methacrylamide, N-ethyl methacrylamide, N-benzyl methacrylamide, N-phenyl methacrylamide and N,N-dimethyl methacrylamide.

Examples of the vinyl compound include vinyl ether, methyl vinyl ether, benzyl vinyl ether, 2-hydroxyethyl vinyl ether, phenyl vinyl ether and propyl vinyl ether.

Examples of the styrene compound include styrene, methylstyrene, chlorostyrene, bromostyrene and hydroxystyrene.

Examples of the maleimide compound include maleimide, N-methylmaleimide, N-phenylmaleimide and N-cyclohexylmaleimide.

In these compounds, a benzene ring, a naphthalene ring, an anthracene ring, or the like has light absorptivity, and the compound acts as a light absorbing compound.

The production of the polymer using the above addition polymerizable monomer can be performed by a method including: dissolving an addition polymerizable monomer and a chain transfer agent (in an amount of 10% or less, based on the mass of the monomer) added if necessary in an organic solvent; adding a polymerization initiator to the resultant solution to perform a polymerization reaction; and adding a polymerization terminator to the resultant mixture. The additive amount of the polymerization initiator is 1 to 10% and the additive amount of the polymerization terminator is 0.01 to 0.2%, based on the mass of the monomer. Examples of the adopted organic solvent include propylene glycol monomethyl ether, propylene glycol monopropyl ether, ethyl lactate and dimethyl formamide; examples of the chain transfer agent include dodecane thiol and dodecyl thiol; examples of the polymerization initiator include azobisisobutyronitrile and azobiscyclohexanecarbonitrile; and examples of the polymerization terminator include 4-methoxyphenol. The reaction temperature is appropriately selected from 30 to 100° C. and the reaction time is appropriately selected from 1 to 24 hour(s).

In the production of the polymer containing a unit structure represented by Formula (4) using the above addition polymerizable monomer, when an addition polymerizable monomer having a protected carboxyl group represented by Formula (3) and another addition polymerizable monomer are used, the adopted ratio thereof in a mass ratio of: addition polymerizable monomer having a protected carboxyl group represented by Formula (3)/another addition polymerizable monomer is, for example, 10/1 to 1/10, preferably 5/1 to 1/5, or 3/1 to 1/3.

The polymer containing a unit structure represented by Formula (4) used in the resist underlayer film forming composition of the present invention has a mass average molecular mass of, for example, 1,000 to 500,000, or for example 1,000 to 200,000, or 3,000 to 150,000, or 3,000 to 50,000.

When the polymer containing a unit structure represented by Formula (4) is used in the resist underlayer film forming composition of the present invention, one type of polymer may be individually used or two or more types of polymers may be used in combination.

The polymer containing a unit structure represented by Formula (4) used in the resist underlayer film forming composition of the present invention may be any of a random polymer, a block polymer and a graft polymer. Then, such a polymer can be produced by a method such as a radical polymerization, an anion polymerization and a cation polymerization. In addition, the form of the polymerization include a method such as a solution polymerization, a suspension polymerization, an emulsion polymerization and a bulk polymerization.

The compound having a group reactable with a carboxyl group contained in the resist underlayer film forming composition of the present invention is not particularly limited so long as the compound has a group capable of forming a chemical bond by being reacted with a carboxyl group.

Examples of the group reactable with a carboxyl group include an epoxy group, an oxetanyl group, an oxazoline group, a cyclocarbonate group, an alkoxysilyl JO group, an alkoxyalkyl group, an aziridinyl group, a methylol group, a hydroxyl group, an isocyanate group, an acetal group, a hydroxysilyl group, a ketal group, a vinylether group, an aminomethylol group, an alkoxymethylamino group and an imino group.

Examples of the compound include the compound having an epoxy group such as triglycidyl-p-aminophenol, tetraglycidyl methaxylenediamine, tetraglycidyl diaminodiphenylmethane, tetraglycidyl-1,3-bisaminomethylcyclohexane, bisphenol-A-diglycidyl ether, bisphenol-s-diglycidyl ether, resorcinol-diglycidyl ether, diglycidyl phthalate ester, neopentylglycol diglycidyl ether, polypropylene glycol diglycidyl ether, cresolnovolac polyglycidyl ether, tetrabromobisphenol-A-diglycidyl ether, bisphenolhexafluoroacetone diglycidyl ether, glycerin triglycidyl ether, pentaerithritol diglycidyl ether, tris-(2,3-epoxypropyl)-isocyanurate, monoallyl diglycidyl isocyanurate and glycidyl methacrylate.

Examples of the compound having a cyclocarbonate group include compounds having a cyclocarbonate group obtained by a reaction of the above compound having an epoxy group with carbon dioxide, 1,2-propylene carbonate, phenyldioxolone, vinylethylene carbonate, butylene carbonate, tetrachloroethylene carbonate, chloroethylene glycol carbonate, 4-chloromethyl-1,3-dioxolane-2-one, 1,2-dichloroethylene carbonate, 4-(1-propenyloxymethyl)-1,3-dioxolane-2-one, glycerin carbonate, (chloromethyl)ethylene carbonate, 1-benzylglycerol-2,3-carbonate, 4,4-dimethyl-5-methylene-1,3-dioxolane-2-one and 3,3,3-trifluoropropylene carbonate.

Examples of the compound having an isocyanate group include p-phenylene diisocyanate, biphenyl diisocyanate, methylene bis(phenyl isocyanate), 2-isocyanate ethylmethacrylate, 1,4-cyclohexyl diisocyanate, 1,3,5-tris(6-isocyanatehexyl)triazine trione, 1-isocyanate naphthalene, 1,5-naphthalene diisocyanate, 1-butyl isocyanate, cyclohexyl isocyanate, benzyl isocyanate, 4-chlorophenyl isocyanate, isocyanate trimethylsilane and hexyl isocyanate.

Examples of the compound having an alkoxysilyl group include triethoxyoctylsilane, tris(3-(trimethoxysilyl)propyl) isocyanurate, 3-(trimethoxysilyl)-N-(3-(trimethoxysilyl) propyl)-1-propaneamine, 3-(trimethoxysilyl)propyl methacrylate, 3-isocyanatepropyl triethoxysilane, 1,4-bis (trimethoxysilylethyl)benzene, phenyltriethoxysilane, methyltriethoxysilane, (3-trimethoxysilylpropyl)maleate, 3-(2-aminoethylamino)propyltrimethoxysilane, methyltriacetoxysilane, trimethoxy-2-(3,4-epoxycyclohexyl)ethylsilane, 3-trimethoxysilylpropyl methacrylate, trimethoxypropylsilane, 4-(chloromethyl)phenyltrimethoxysilane, 2-(3,4-epoxycyclohexyl)ethyltriethoxysilane, triethoxy-n-dodecylsilane and 2-mercaptoethyl triethoxysilane.

As the compound having a group reactable with a carboxyl group contained in the resist underlayer film forming composition of the present invention, a compound having at least two groups represented by Formula (5) can also be used. In Formula (5), $R_5$ represents a hydrogen atom, an alkyl group having 1 to 6 carbon atom(s) or —$CH_2OR_7$ (where $R_7$ represents a hydrogen atom or an alkyl group having 1 to 10 carbon atom(s)); and $R_6$ represents a hydrogen atom or an alkyl group having 1 to 10 carbon atom(s). Examples of the alkyl group include a methyl group, an ethyl group, an n-butyl group, an n-octyl group, an isopropyl group, a tert-butyl group, a 2-ethylhexyl group and a cyclohexyl group.

Examples of such a compound include: melamine compounds, urea compounds, glycoluryl compounds and benzoguanamine compounds in which hydrogen atoms in an amino group are substituted with methylol groups or alkoxymethyl groups. Specific examples thereof include hexamethoxymethylmelamine, tetramethoxymethylbenzoguanamine, 1,3,4,6-tetrakis(butoxymethyl)glycoluryl, 1,3,4,6-tetrakis(hydroxymethyl)glycoluryl, 1,3-bis(hydroxymethyl) urea, 1,1,3,3-tetrakis(butoxymethyl)urea, 1,1,3,3-tetrakis (methoxymethyl)urea, 1,3-bis(hydroxymethyl)-4,5-dihydroxy-2-imidazoline and 1,3-bis(methoxymethyl)-4,5-dimethoxy-2-imidazolinone; and also compounds such as methoxymethyl-type melamine compounds (trade name: Cymel 300, Cymel 301, Cymel 303, Cymel 350), butoxymethyl-type melamine compounds (trade name: Mycoat 506, Mycoat 508), glycoluryl compounds (trade name: Cymel 1170, Powderlink 1174), which are manufactured by MT AquaPolymer, Inc.; a methylated urea resin (trade name: UFR 65); butylated urea resins (trade name: UFR 300, U-VAN10S60, U-VAN10R, U-VAN11HV); and urea/formamide-based resins (highly condensed-type, trade name: Beckamine J-300S, Beckamine P-955, Beckamine N) manufactured by DIC Corporation. In addition, the compound may be a compound obtained by condensing melamine compounds, urea compounds, glycoluryl compounds and benzoguanamine compounds in which hydrogen atoms in amino groups are substituted with methylol groups or alkoxymethyl groups, and examples of such a compound include compounds with high molecular mass produced from a melamine compound (trade name: Cymel 303) and a benzoguanamine compound (trade name: Cymel 1123) described in U.S. Pat. No. 6,323,310.

As the compound having at least two groups represented by Formula (5) contained in the resist underlayer film forming composition of the present invention, there can be also used polymers produced by using acrylamide compounds or methacrylamide compounds substituted with hydroxymethyl groups or alkoxymethyl groups such as N-hydroxymethylacrylamide, N-methoxymethylmetacrylamide, N-ethoxymethylacrylamide and N-butoxymethylmethacrylamide. Such polymers can be produced from acrylamide compounds or methacrylamide compounds substituted with hydroxymethyl groups or alkoxymethyl groups only. The polymers can be also produced by using the above substituted acrylamide compounds or the substituted methacrylamide compounds in combination with the above other addition polymerizable monomer such as acrylic ester compounds, methacrylic ester compounds, acrylamide compounds, methacrylamide compounds, vinyl compounds, styrene compounds, maleimide compounds, maleic anhydride and acrylonitrile. In the production of the polymer, when the other addition polymerizable monomer is used, the adopted ratio thereof in mass ratio: an acrylamide compound or methacrylamide compound substituted with hydroxymethyl groups or alkoxymethyl groups/ other addition polymerizable monomer is, for example, 10/1 to 1/10, preferably 5/1 to 1/5, or 3/1 to 1/3.

Examples of such a polymer include a copolymer of poly (N-butoxymethylacrylamide), N-butoxymethylacrylamide and styrene, a copolymer of N-hydroxymethylmethacrylamide and methylmethacrylate, a copolymer of N-ethoxymethylmethacrylamide and benzylmethacrylate and a copolymer of N-butoxymethylacrylamide, benzylmethacrylate and 2-hydroxypropylmethacrylate. Such a polymer has a mass average molecular mass of, for example, 1,000 to 500,000, or for example 1,000 to 200,000, or 3,000 to 150,000, or 3,000 to 50,000. As the polymer, one type of polymer may be individually used or two or more types of polymers may also be used in combination.

In the above compounds, a hetero ring such as a triazine ring exhibits light absorptivity and the compound acts as a light absorbing compound.

As the compound having a group reactable with a carboxyl group contained in the resist underlayer film forming composition of the present invention, polymers containing at least one type of unit structure selected from a group consisting of unit structures represented by Formulae (6), (7), (8), (9), (10) and (11) can also be used. In the formulae, P represents a ligand constituting a main chain of the polymer; Q represents a direct bonding or a linking group; $R_8$, $R_9$, $R_{10}$ and $R_{11}$ individually represent a hydrogen atom or an alkyl group having 1 to 6 carbon atom(s); and x represents 0 or 1. P is not particularly limited so long as it is a ligand constituting a main chain of the polymer. Examples of P include groups represented by Formulae (P-1) to (P-4). Examples of Q include linking groups which contain at least one linking group selected from a phenylene group, —C(=O)—, —CH$_2$—, —NH— and —O—, or direct bonding.

[Chemcial Formula 10]

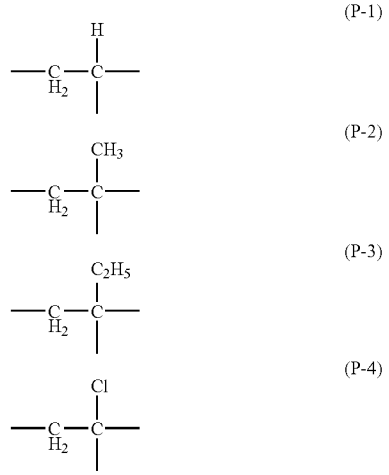

Such polymers can be produced using addition polymerizable monomers having an epoxy group, an oxetanyl group, an oxazoline group, a cyclocarbonate group, an alkoxysilyl group or an isocyanate group. Then, in the production of the polymer, the other addition polymerizable monomers such as acrylate ester compounds, methacrylate ester compounds, acrylamide compounds, methacrylamide compounds, vinyl compounds, styrene compounds, maleimide compounds, maleic anhydrides and acrylonitrile can be used in combination with the above addition-polymerizable monomer. In the production of the polymer, when other addition-polymerizable monomers are used, the adopted ratio in mass ratio: an addition polymerizable monomer having an epoxy group, an oxetanyl group, an oxazoline group, a cyclocarbonate group, an alkoxysilyl group or an isocyanate group/other addition-polymerizable monomers is, for example, 10/1 to 1/10, preferably 5/1 to 1/5, or 3/1 to 1/3.

Examples of the addition polymerizable monomer having an epoxy group include glycidyl acrylate and glycidyl methacrylate.

Examples of the addition polymerizable monomer having an oxetanyl group include (3-ethyl-3-oxetanyl)methyl methacrylate, oxetane-3-yl-methylacrylate, (3-methyl-3-oxetanyl)methylmethacrylate, oxetane-2-yl-methylacrylate and oxetane-2-yl-methylmethacrylate.

Examples of the addition polymerizable monomer having an oxazoline group include 2-isopropenyl-2-oxazoline.

Examples of the addition polymerizable monomer having a cyclocarbonate group include vinylethylene carbonate.

Examples of the addition polymerizable monomer having an alkoxysilyl group include vinyltrimethoxysilane, 3-methacryloxypropyltrimethoxysilane, 3-methacryloxypropyltriethoxysilane, 3-methacryloxypropylmethyldiethoxysilane and 3-acryloxypropyltrimethoxysilane.

Examples of the addition polymerizable monomer having an isocyanate group include 2-isocyanateethyl methacrylate and allyl isocyanate.

The polymer containing a unit structure represented by Formula (6) can also be produced by a reaction of a polymer having a hydroxyl group with a compound having an epoxy group such as epichlorobydrin and glycidyl tosylate. Examples of the polymer include epoxyphenolnovolak produced from phenolnovolac and epichlorohydrin, epoxycresolnovolak and epoxynaphtholnovolac.

The polymer containing at least one type of unit structure selected from a group consisting of unit structures represented by Formulae (6), (7), (8), (9), (10) and (11) has a mass average molecular mass of, for example, 1,000 to 500,000, or for example 1,000 to 200,000, 3,000 to 150,000, or 3,000 to 50,000. As the polymer, one type of polymer may be used individually or two or more types of polymers may also be used in combination.

In the resist underlayer film forming composition of the present invention, the content ratio of the compound having a protected carboxyl group represented by Formula (3) and the compound having a group readable with a carboxyl group in the mass ratio: the compound having a protected carboxyl group represented by Formula (3)/the compound having a group reactable with a carboxyl group is, for example, 10/1 to 1/10, preferably 5/1 to 1/5, 3/1 to 1/3, or 2/1 to 1/2.

Examples of the group reactable with a carboxyl group include the same groups as those described above.

Examples of such a compound include compounds having a protected carboxyl group represented by Formula (3) and an epoxy group which are produced from compounds having an olefin portion and a carboxyl group. The compound having a protected carboxyl group represented by Formula (3) and an epoxy group can be produced by reacting a carboxyl group with a compound represented by Formula (12) and by epoxydizing an olefin portion of the resultant compound.

Examples of the compound having a group reactable with a carboxyl group and a protected carboxyl group represented by Formula (3) include polymers having a protected carboxyl group represented by Formula (3) and a group represented by Formula (5). Such a polymer can be produced by a polymerization reaction of an addition polymerizable monomer having a protected carboxyl group represented by Formula (3) with an acrylamide compound or a methacrylamide compound substituted with a hydroxy methyl group or an alkoxy methyl group. Examples of the addition polymerizable monomer having a protected carboxyl group represented by Formula (3) include: methacrylate hemiacetal ester compounds such as 1-methoxyethyl methacrylate, 1-ethoxyethyl methacrylate, 1-isopropoxyethyl methacrylate, 1-n-hexyloxyethyl methacrylate and tetrahydro-2H-pyran-2-yl-methacrylate; acrylate hemiacetal ester compounds such as 1-methoxyethyl acrylate, 1-tert-butoxyethyl acrylate, 1-isopropoxyethyl acrylate, 1-n-butoxyethyl acrylate and tetrahydro-2H-pyran-2-yl-acrylate; 1-ethoxyethyl-4-vinylbenzoate; bis(1-ethoxyethyl)maleate; and methyl(1-ethoxyethyl)maleate. Examples of the acrylamide compound or the methacrylamide compound substituted with a hydroxy methyl group or an alkoxy methyl group include: N-hydroxymethyl acrylamide, N-methoxymethyl methacrylamide, N-ethoxymethyl acrylamide and N-butoxymethyl methacrylamide. In the production of the polymer, if necessary, the above other addition polymerizable monomers can be used. The ratio of the addition polymerizable monomer having a protected carboxyl group represented by Formula (3) and the acrylamide compound or methacrylamide compound substituted with a hydroxy methyl group or an alkoxy methyl group which are used in the production of the polymer in a mass ratio: addition polymerizable monomer having a protected carboxyl group represented by Formula (3)/acrylamide compound or methacrylamide compound substituted with a hydroxy methyl group or an alkoxy methyl group is, for example, 10/1 to 1/10, preferably 5/1 to 1/5, or 3/1 to 1/3. Then, when the above other addition polymerizable monomer is used, the ratio thereof in all monomers used for the production of the polymer is, for example, 0.5 to 80% by mass, or 1 to 70% by mass, or 5 to 50% by mass. Such a polymer can be produced by, for example, the above method using a polymerization initiator. Such a polymer has a mass average molecular mass of, for example 1,000 to 500,000, or for example, 1,000 to 200,000, or 3,000 to 150,000, or 3,000 to 50,000. As the polymer, one type of polymer may be used individually or two or more types of polymers may be used in combination.

As the compound having a group reactable with a carboxyl group and having a protected carboxyl group represented by Formula (3), a polymer containing a unit structure represented by Formula (4) and at least one type of unit structure selected from a group consisting of unit structures represented by Formulae (6), (7), (8), (9), (10) and (11), can also be used. Such a polymer can be produced by, for example, a polymerization reaction of the addition polymerizable monomer having a protected carboxyl group represented by Formula (3) with the above addition polymerizable monomer having an epoxy group, an oxetanyl group, an oxazoline group, a cyclocarbonate group, an alkoxysilyl group or an isocyanate group. In the production of the polymer, other addition polymerizable monomers as described above, or the acrylamide compound or methacrylamide compound substituted with a hydroxy methyl group or an alkoxy methyl group as described above can be used in combination if necessary.

The ratio of the addition polymerizable monomer having a protected carboxyl group represented by Formula (3) and the addition polymerizable monomer having an epoxy group, an oxetanyl group, an oxazoline group, a cyclocarbonate group, an alkoxysilyl group or an isocyanate group which are used in the production of the polymer in a mass ratio: addition polymerizable monomer having a protected carboxyl group represented by Formula (3)/addition polymerizable monomer having an epoxy group, an oxetanyl group, an oxazoline group, a cyclocarbonate group, an alkoxysilyl group or an isocyanate group is, for example, 10/1 to 1/10, preferably 5/1 to 1/5, or 3/1 to 1/3. Then, when the above other addition polymerizable monomer, or the acrylamide compound or methacrylamide compound substituted with a hydroxy methyl group or an alkoxy methyl group is used, the ratio thereof in all monomers used for the production of the polymer is, for example, 0.5 to 80% by mass, or 1 to 70% by mass, or 5 to 50% by mass. Such a polymer can be produced by, for example, the above method using a polymerization initiator. Such a polymer has a mass average molecular mass of, for example, 1,000 to 500,000, or for example 1,000 to 200,000, or 3,000 to 150,000, or 3,000 to 50,000. As the polymer, one type of polymer may be used individually or two or more types of polymers may be used in combination.

Examples of the compound having a group reactable with a carboxyl group and having a protected carboxyl group represented by Formula (3) which is contained in the resist underlayer film forming composition of the present invention, include polymers represented by the following Formulae [1-9] to [1-34] (wherein p, q, r and s represent a ratio of each unit structure in a polymer).

[Chemical Formula 11]

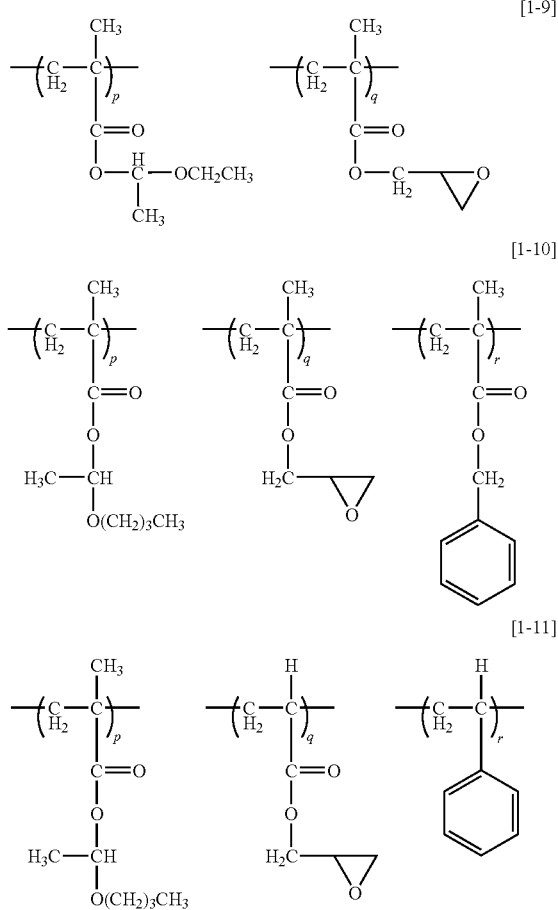

[Chemical Formula 12]
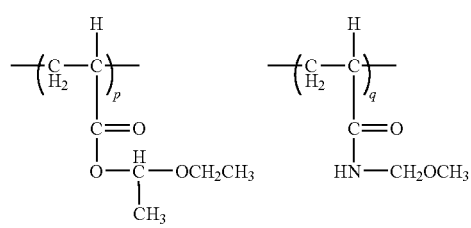 [1-12]
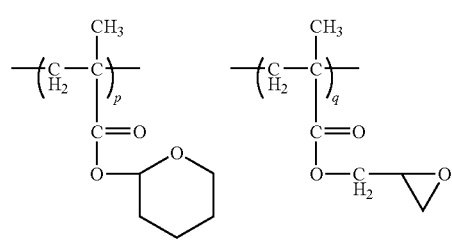 [1-13]
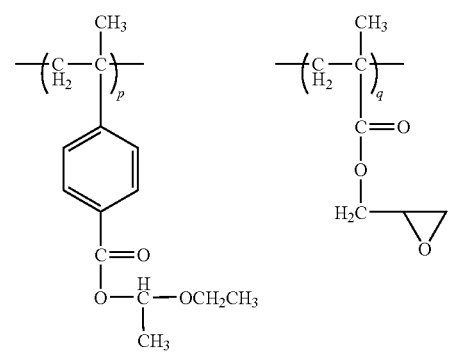 [1-14]
[Chemical Formula 13]
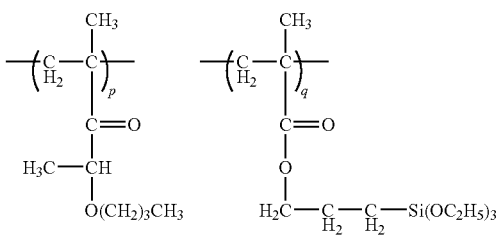 [1-15]
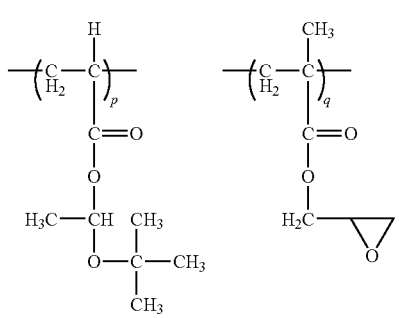 [1-16]
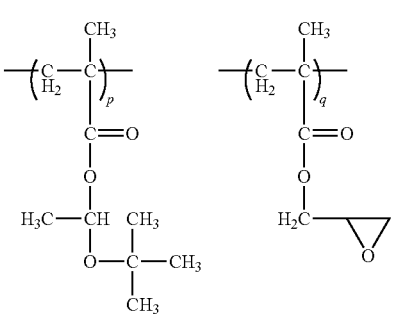 [1-17]
[Chemical Formula 14]
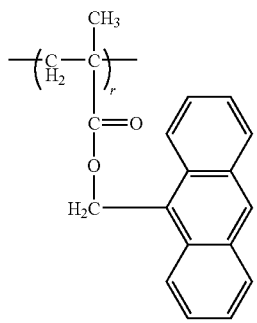 [1-18]
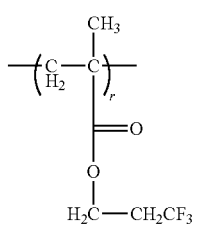 [1-19]

[1-20]
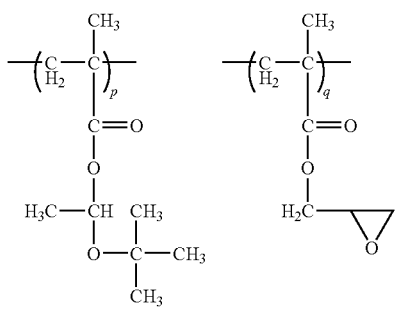
[Chemical Formula 15]
[1-21]
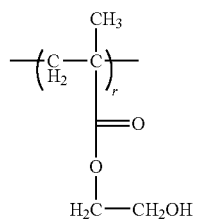
[1-22]
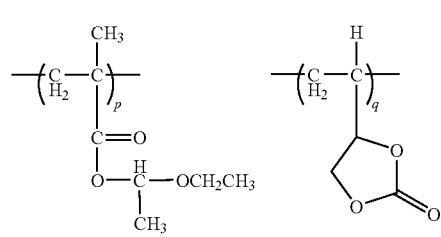
[1-23]
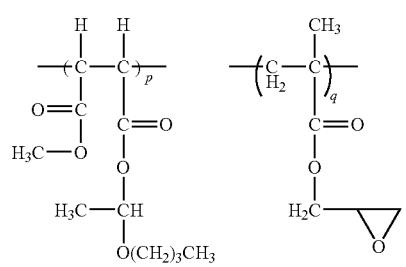
[Chemical Formula 16]
[1-24]
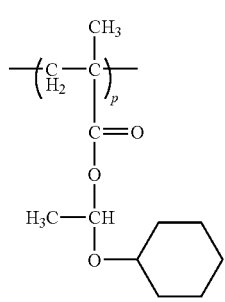
[1-25]
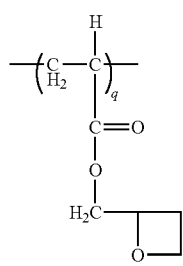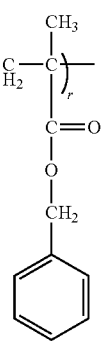
[1-26]
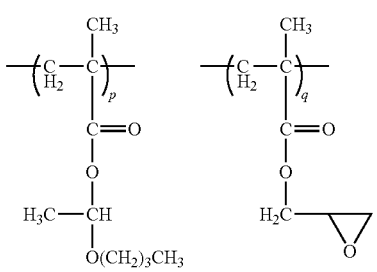
[Chemical Formula 17]
[1-27]
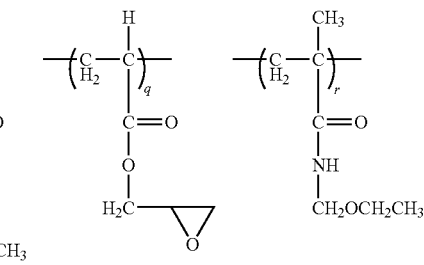
[1-28]
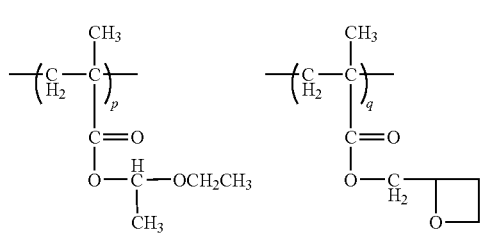

[Chemical Formula 18]

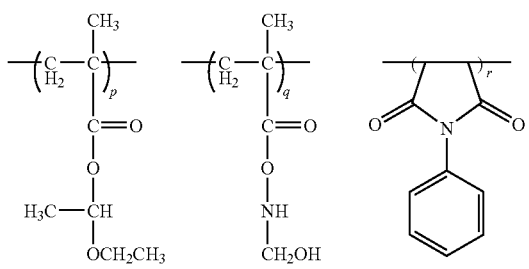
[1-29]

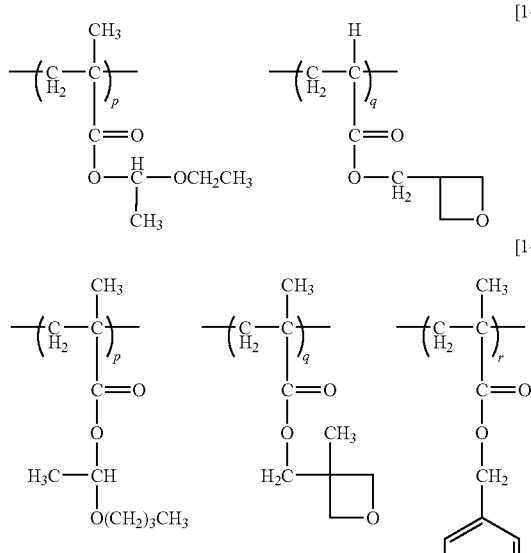
[1-30]
[1-31]
[1-32]

[Chemical Formula 19]

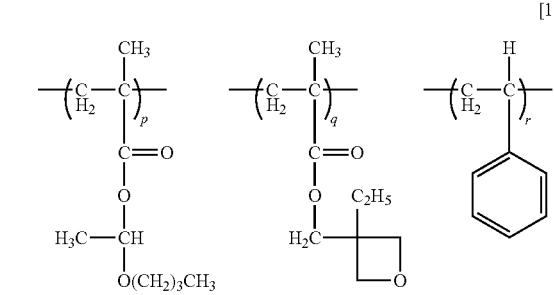
[1-33]

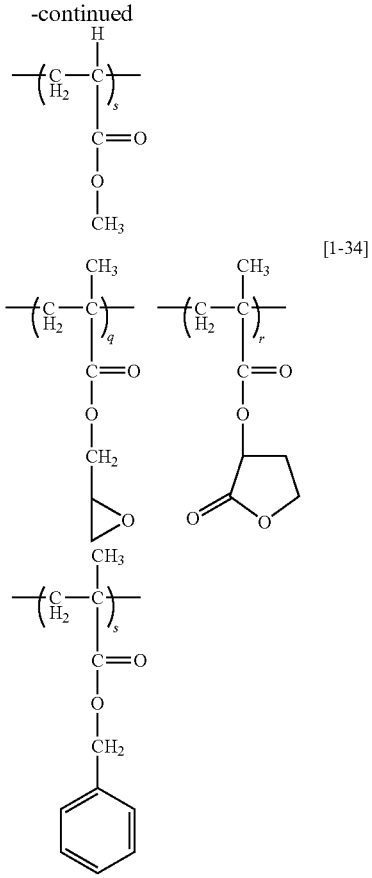
[1-34]

The liquid additive (B) used in the resist underlayer film forming composition of the present invention exists as a liquid under atmospheric pressure at a temperature of normal temperature (20° C.) to around 270° C. Specifically, it is aliphatic polyether. This aliphatic polyether is polyether polyol, polyglycidyl ether or a combination thereof.

The amount of the liquid additive (B) contained in the resist underlayer film forming composition of the present invention is 1 to 40% by mass, or 1 to 30% by mass, or 1 to 20% by mass, based on the mass of the solid content.

Examples of the polyether polyol include compounds represented by Formula (1). In Formula (1), $R_1$ represents a hydrogen atom or an alkyl group having 1 to 10 carbon atom(s).

Examples of the alkyl group include a methyl group, an ethyl group, a propyl group, an isopropyl group, an n-butyl group and an n-pentyl group, and a methyl group is preferred. When $R_1$ is a hydrogen atom, Formula (1) represents polyoxyethylene polyether; when $R_1$ is a methyl group, Formula (1) represents polyoxypropylene polyether; and when $R_1$ is an alkyl group, Formula (1) represents polyoxyalkylene polyol.

$R_2$ represents an alkyl group having 1 to 10 carbon atom(s), an alkenyl group having 2 to 6 carbon atoms, an alkynyl group having 2 to 10 carbon atoms, an alkylcarbonyl group having 2 to 10 carbon atoms, an alkylcarbonylamino group having 2 to 10 carbon atoms, an alkyloxyalkyl group having 2 to 10 carbon atoms, an alkylamino group having 1 to 10 carbon atom(s), an alkyldiamino group having 1 to 10 carbon atom(s) or a combination thereof, n is an integer of 1 to 300, preferably 2 to 30, more preferably 2 to 10. m is an integer of 2 to 6.

The above functional group represents a monovalent organic group. However, the valence thereof can be changed in a range where hydrogen atoms contained in the organic group can be substituted with polyoxyalkylene groups, and is an organic group having divalence, trivalence, tetravalence, pentavalence or hexavalence corresponding to the number m of polyoxyalkylene groups.

In addition, these functional groups may be substituted with a hydroxyl group, an amino group, a cyano group, a halogen group, a nitro group, a thiol group, or the like.

Examples of the above alkyl group include a methyl group, an ethyl group, an n-propyl group, an isopropyl group, a cyclopropyl group, an n-butyl group, an isobutyl group, an s-butyl group, a tert-butyl group, a cyclobutyl group, a 1-methyl-cyclopropyl group, a 2-methyl-cyclopropyl group, an n-pentyl group, a 1-methyl-n-butyl group, a 2-methyl-n-butyl group, a 3-methyl-n-butyl group, a 1,1-dimethyl-n-propyl group, a 1,2-dimethyl-n-propyl group, a 2,2-dimethyl-n-propyl group, a 1-ethyl-n-propyl group, a cyclopentyl group, a 1-methyl-cyclobutyl group, a 2-methyl-cyclobutyl group, a 3-methyl-cyclobutyl group, a 1,2-dimethyl-cyclopropyl group, a 2,3-dimethyl-cyclopropyl group, a 1-ethyl-cyclopropyl group, a 2-ethyl-cyclopropyl group, an n-hexyl group, a 1-methyl-n-pentyl group, a 2-methyl-n-pentyl group, a 3-methyl-n-pentyl group, a 4-methyl-n-pentyl group, a 1,1-dimethyl-n-butyl group, a 1,2-dimethyl-n-butyl group, a 1,3-dimethyl-n-butyl group, a 2,2-dimethyl-n-butyl group, a 2,3-dimethyl-n-butyl group, a 3,3-dimethyl-n-butyl group, a 1-ethyl-n-butyl group, a 2-ethyl-n-butyl group, a 1,1,2-trimethyl-n-propyl group, a 1,2,2-trimethyl-n-propyl group, a 1-ethyl-1-methyl-n-propyl group, a 1-ethyl-2-methyl-n-propyl group, a cyclohexyl group, a 1,4-dimethyl-cyclohexyl group, a 1-methyl-cyclopentyl group, a 2-methyl-cyclopentyl group, a 3-methyl-cyclopentyl group, a 1-ethyl-cyclobutyl group, a 2-ethyl-cyclobutyl group, a 3-ethyl-cyclobutyl group, a 1,2-dimethyl-cyclobutyl group, a 1,3-dimethyl-cyclobutyl group, a 2,2-dimethyl-cyclobutyl group, a 2,3-dimethyl-cyclobutyl group, a 2,4-dimethyl-cyclobutyl group, a 3,3-dimethyl-cyclobutyl group, a 1-n-propyl-cyclopropyl group, a 2-n-propyl-cyclopropyl group, a 1-isopropyl-cyclopropyl group, a 2-isopropyl-cyclopropyl group, a 1,2,2-trimethyl-cyclopropyl group, a 1,2,3-trimethyl-cyclopropyl group, a 2,2,3-trimethyl-cyclopropyl group, a 1-ethyl-2-methyl-cyclopropyl group, a 2-ethyl-1-methyl-cyclopropyl group, a 2-ethyl-2-methyl-cyclopropyl group and a 2-ethyl-3-methyl-cyclopropyl group.

Examples of the above alkenyl group include an ethenyl group, a 1-propenyl group, a 2-propenyl group, a 1-methyl-1-ethenyl group, a 1-butenyl group, a 2-butenyl group, a 3-butenyl group, a 2-methyl-1-propenyl group, a 2-methyl-2-propenyl group, a 1-ethyl-ethenyl group, a 1-methyl-1-propenyl group, a 1-methyl-2-propenyl group, a 1-pentenyl group, a 2-pentenyl group, a 3-pentenyl group, a 4-pentenyl group, a 1-n-propyl-ethenyl group, a 1-methyl-1-butenyl group, a 1-methyl-2-butenyl group, a 1-methyl-3-butenyl group, a 2-ethyl-2-propenyl group, a 2-methyl-1-butenyl group, a 2-methyl-2-butenyl group, a 2-methyl-3-butenyl group, a 3-methyl-1-butenyl group, a 3-methyl-2-butenyl group, a 3-methyl-3-butenyl group, a 1,1-dimethyl-2-propenyl group, a 1-isopropyl-ethenyl group, a 1,2-dimethyl-1-propenyl group, a 1,2-dimethyl-2-propenyl group, a 1-cyclopentenyl group, a 2-cyclopentenyl group, a 3-cyclopentenyl group, a 1-hexenyl group, a 2-hexenyl group, a 3-hexenyl group, a 4-hexenyl group, a 5-hexenyl group, a 1-methyl-1-pentenyl group, a 1-methyl-2-pentenyl group, a 1-methyl-3-pentenyl group, a 1-methyl-4-pentenyl group, a 1-butyl-etenyl group, a 2-methyl-1-pentenyl group, a 2-methyl-2-pentenyl group, a 2-methyl-3-pentenyl group, a 2-methyl-4-pentenyl group, a 2-n-propyl-2-propenyl group, a 3-methyl-1-pentenyl group, a 3-methyl-2-pentenyl group, a 3-methyl-3-pentenyl group, a 3-methyl-4-pentenyl group, a 3-ethyl-3-butenyl group, a 4-methyl-1-pentenyl group, a 4-methyl-2-pentenyl group, a 4-methyl-3-pentenyl group, a 4-methyl-4-pentenyl group, a 1,1-dimethyl-2-butenyl group, a 1,1-dimethyl-3-butenyl group, a 1,2-dimethyl-1-butenyl group, a 1,2-dimethyl-2-butenyl group, a 1,2-dimethyl-3-butenyl group, a 1-methyl-2-ethyl-2-propenyl group, a 1-s-butyl-etenyl group, a 1,3-dimethyl-1-butenyl group, a 1,3-dimethyl-2-butenyl group, a 1,3-dimethyl-3-butenyl group, a 1-isobutyl-etenyl group, a 2,2-dimethyl-3-butenyl group, a 2,3-dimethyl-1-butenyl group, a 2,3-dimethyl-2-butenyl group, a 2,3-dimethyl-3-butenyl group, a 2-isopropyl-2-propenyl group, a 3,3-dimethyl-1-butenyl group, a 1-ethyl-1-butenyl group, a 1-ethyl-2-butenyl group, a 1-ethyl-3-butenyl group, a 1-n-propyl-1-propenyl group, a 1-n-propyl-2-propenyl group, a 2-ethyl-1-butenyl group, a 2-ethyl-2-butenyl group, a 2-ethyl-3-butenyl group, a 1,1,2-trimethyl-2-propenyl group, a 1-tert-butyl-etenyl group, a 1-methyl-1-ethyl-2-propenyl group, a 1-ethyl-2-methyl-1-propenyl group, a 1-ethyl-2-methyl-2-propenyl group, a 1-isopropyl-1-propenyl group, a 1-isopropyl-2-propenyl group, a 1-methyl-2-cyclopentenyl group, a 1-methyl-3-cyclopentenyl group, a 2-methyl-1-cyclopentenyl group, a 2-methyl-2-cyclopentenyl group, a 2-methyl-3-cyclopentenyl group, a 2-methyl-4-cyclopentenyl group, a 2*methyl-5-cyclopentenyl group, a 2-methylene-cyclopentyl group, a 3-methyl-1-cyclopentenyl group, a 3-methyl-2-cyclopentenyl group, a 3-methyl-3-cyclopentenyl group, a 3-methyl-4-cyclopentenyl group, a 3-methyl-5-cyclopentenyl group, a 3-methylene-cyclopoentyl group, a 1-cyclohexenyl group, a 2-cyclohexenyl group and a 3-cyclohexenyl group.

Examples of the above alkynyl group include an ethynyl group, a 1-propynyl group, a 2-propynyl group, a 1-butynyl group, a 2-butynyl group, a 3-butynyl group, a 1-methyl-2-propynyl group, a 1-pentynyl group, a 2-pentynyl group, a 3-pentynyl group, a 4-pentynyl group, a 1-methyl-2-butynyl group, a 1-methyl-3-butynyl group, a 2-methyl-3-butynyl group, a 3-methyl-1-butynyl group, a 1,1-dimethyl-2-propynyl group, a 2-ethyl-2-propynyl group, a 1-hexynyl, a 2-hexynyl group, a 3-hexynyl group, a 4-hexynyl group, a 5-hexynyl group, a 1-methyl-2-pentynyl group, a 1-methyl-3-pentynyl group, a 1-methyl-4-pentynyl group, a 2-methyl-3-pentynyl group, a 2-methyl-4-pentynyl group, a 3-methyl-1-pentynyl group, a 3-methyl-4-pentynyl group, a 4-methyl-1-pentynyl group, a 4-methyl-2-pentynyl group, a 1,1-dimethyl-2-butynyl group, a 1,1-dimethyl-3-butynyl group, a 1,2-dimethyl-3-butynyl group, a 2,2-dimethyl-3-butynyl group, a 3,3-dimethyl-1-butynyl group, a 1-ethyl-2-butynyl group, a 1-ethyl-3-butynyl group, a 1-n-propyl-2-propynyl group, a 2-ethyl-3-butynyl group, a 1-methyl-1-ethyl-2-propynyl group and a 1-isopropyl-2-propynyl group.

Examples of the above alkylcarbonyl group include a methylcarbonyl group, an ethylcarbonyl group, an n-propylcarbonyl group, an isopropylcarbonyl group, a cyclopropylcarbonyl group, an n-butylcarbonyl group, an isobutylcarbonyl group, an s-butylcarbonyl group, a tert-butylcarbonyl group, a cyclobutylcarbonyl group, a 1-methyl-cyclopropylcarbonyl group, a 2-methyl-cyclopropylcarbonyl group, an n-pentylcarbonyl group, a 1-methyl-n-butylcarbonyl group, a 2-methyl-n-butylcarbonyl group, a 3-methyl-n-butylcarbonyl group, a 1,1-dimethyl-n-propylcarbonyl group, a 1,2-dimethyl-n-propylcarbonyl group, a 2,2-dimethyl-n-propylcarbonyl group, a 1-ethyl-n-propylcarbonyl group, a cyclopentylcarbonyl group, a 1-methyl-cyclobutylcarbonyl group, a 2-methyl-cyclobutylcarbonyl group, a 3-methyl-cyclobutylcarbonyl group, a 1,2-dimethyl-cyclopropylcarbonyl group, a 2,3-dimethyl-cyclopropylcarbonyl group, a 1-ethyl-cyclopropylcarbonyl group, a 2-ethyl-cyclopropylcarbonyl group, an n-hexylcarbonyl group, a 1-methyl-n-pentylcarbonyl group, a 2-methyl-n-pentylcarbonyl group, a 3-methyl-n-pentylcarbonyl group, a 4-methyl-n-pentylcarbonyl group, a 1,1-dimethyl-n-butylcarbonyl group, a 1,2-dimethyl-n-butylcarbonyl group, a 1,3-dimethyl-n-butylcarbonyl group, a 2,2-dimethyl-n-butylcarbonyl group, a 2,3-dimethyl-n-butylcarbonyl group, a 3,3-dimethyl-n-butylcarbonyl group, a 1-ethyl-n-butyl carbonyl group, a 2-ethyl-n-butylcarbonyl group, a 1,1,2-trimethyl-n-propylcarbonyl group, a 1,2,2-trimethyl-n-propylcarbonyl group, a 1-ethyl-1-methyl-n-propylcarbonyl group, a 1-ethyl-2-methyl-n-propylcarbonyl group, a cyclohexylcarbonyl group, a 1-methyl-cyclopentylcarbonyl group, a 2-methyl-cyclopentylcarbonyl group, a 3-methyl-cyclopentylcarbonyl group, a 1-ethyl-cyclobutylcarbonyl group, a 2-ethyl-cyclobutylcarbonyl group, a 3-ethyl-cyclobutylcarbonyl group, a 1,2-dimethyl-cyclobutylcarbonyl group, a 1,3-dimethyl-cyclobutylcarbonyl group, a 2,2-dimethyl-cyclobutylcarbonyl group, a 2,3-dimethyl-cyclobutylcarbonyl group, a 2,4-dimethyl-cyclobutylcarbonyl group, a 3,3-dimethyl-cyclobutylcarbonyl group, a 1-n-propyl-cyclopropylcarbonyl group, a 2-n-propyl-cyclopropylcarbonyl group, a 1-isopropyl-cyclopropylcarbonyl group, a 2-isopropyl-cyclopropylcarbonyl group, a 1,2,2-trimethyl-cyclopropylcarbonyl group, a 1,2,3-trimethyl-cyclopropylcarbonyl group, a 2,2,3-trimethyl-cyclopropylcarbonyl group, a 1-ethyl-2-methyl-cyclopropylcarbonyl group, a 2-ethyl-1-methyl-cyclopropylcarbonyl group, a 2-ethyl-2-methyl-cyclopropylcarbonyl group and a 2-ethyl-3-methyl-cyclopropylcarbonyl group.

Examples of the above alkylcarbonylamino group include a methylcarbonylamino group, an ethylcarbonylamino group, an n-propylcarbonylamino group, an isopropylcarbonylamino group, a cyclopropylcarbonylamino group, an n-butylcarbonylamino group, an isobutylcarbonylamino group, an s-butylcarbonylamino group, a tert-butylcarbonylamino group, a cyclobutylcarbonylamino group, a 1-methyl-cyclopropylcarbonylamino group, a 2-methyl-cyclopropylcarbonylamino group, an n-pentylcarbonylamino group, a 1-methyl-n-butylcarbonylamino group, a 2-methyl-n-butylcarbonylamino group, a 3-methyl-n-butylcarbonylamino group, a 1,1-dimethyl-n-propylcarbonylamino group, a 1,2-dimethyl-n-propylcarbonylamino group, a 2,2-dimethyl-n-propylcarbonylamino group, a 1-ethyl-n-propylcarbonylamino group, a cyclopentylcarbonylamino group, a 1-methyl-cyclobutylcarbonylamino group, a 2-methyl-cyclobutylcarbonylamino group, a 3-methyl-cyclobutylcarbonylamino group, a 1,2-dimethyl-cyclopropylcarbonylamino group, a 2,3-dimethyl-cyclopropylcarbonylamino group, a 1-ethyl-cyclopropylcarbonylamino group, a 2-ethyl-cyclopropylcarbonylamino group, an n-hexylcarbonylamino group, a 1-methyl-n-pentylcarbonylamino group, a 2-methyl-n-pentylcarbonylamino group, a 3-methyl-n-pentylcarbonylamino group, a 4-methyl-n-pentylcarbonylamino group, a 1,1-dimethyl-n-butylcarbonylamino group, a 1,2-dimethyl-n-butylcarbonylamino group, a 1,3-dimethyl-n-butylcarbonylamino group, a 2,2-dimethyl-n-butylcarbonylamino group, a 2,3-dimethyl-n-butylcarbonylamino group, a 3,3-dimethyl-n-butylcarbonylamino group, a 1-ethyl-n-butylcarbonylamino group, a 2-ethyl-n-butylcarbonylamino group, a 1,1,2-trimethyl-n-propylcarbonylamino group, a 1,2,2-trimethyl-n-propylcarbonylamino group, a 1-ethyl-1-methyl-n-propylcarbonylamino group, a 1-ethyl-2-methyl-n-propylcarbonylamino group, a cyclohexylcarbonylamino group, a 1-methyl-cyclopentylcarbonylamino group, a 2-methyl-cyclopentylcarbonylamino group, a 3-methyl-cyclopentylcarbonylamino group, a 1-ethyl-cyclobutylcarbonylamino group, a 2-ethyl-cyclobutylcarbonylamino group, a 3-ethyl-cyclobutylcarbonylamino group, a 1,2-dimethyl-cyclobutylcarbonylamino group, a 1,3-dimethyl-cyclobutylcarbonylamino group, a 2,2-dimethyl-cyclobutylcarbonylamino group, a 2,3-dimethyl-cyclobutylcarbonylamino group, a 2,4-dimethyl-cyclobutylcarbonylamino group, a 3,3-dimethyl-cyclobutylcarbonylamino group, a 1-n-propyl-cyclopropylcarbonylamino group, a 2-n-propyl-cyclopropylcarbonylamino group, a 1-isopropyl-cyclopropylcarbonylamino group, a 2-isopropyl-cyclopropylcarbonylamino group, a 1,2,2-trimethyl-cyclopropylcarbonylamino group, a 1,2,3-trimethyl-cyclopropylcarbonylamino group, a 2,2,3-trimethyl-cyclopropylcarbonylamino group, a 1-ethyl-2-methyl-cyclopropylcarbonylamino group, a 2-ethyl-1-methyl-cyclopropylcarbonylamino group, a 2-ethyl-2-methyl-cyclopropylcarbonylamino group and a 2-ethyl-3-methyl-cyclopropylcarbonylamino group.

Examples of the above alkyloxyalkyl group include a methyloxymethyl group, an ethyloxyethyl group, an ethyloxymethyl group, a propyloxypropyl group, a propyloxymethyl group, a tert-butyloxy-tert-butyl group and a methyl-tert-butyl group.

Examples of the above alkylamino group include a methylamino group, an ethylamino group, an n-propylamino group, an isopropylamino group, a cyclopropylamino group, an n-butylamino group, an isobutylamino group, an s-butylamino group, a tert-butylamino group, a cyclobutylamino group, a 1-methyl-cyclopropylamino group, a 2-methyl-cyclopropylamino group, an n-pentylamino group, a 1-methyl-n-butylamino group, a 2-methyl-n-butylamino group, a 3-methyl-n-butylamino group and a 1,1-dimethyl-n-propylamino group.

Examples of the above alkyldiamino group include a methyldiamino group, an ethyldiamino group, an n-propyldiamino group, an isopropyldiamino group, a cyclopropyldiamino group, an n-butyldiamino group, an isobutyldiamino group, an s-butyldiamino group, a tert-butyldiamino group, a cyclobutyldiamino group, a 1-methyl-cyclopropyldiamino group, a 2-methyl-cyclopropyldiamino group, an n-pentyldiamino group, a 1-methyl-n-butyldiamino group, a 2-methyl-n-butyldiamino group, a 3-methyl-n-butyldiamino group and a 1,1-dimethyl-n-propyldiamino group.

Examples of the polyether polyol represented by Formula (1) are represented by Formula [2-1] to Formula [2-18].

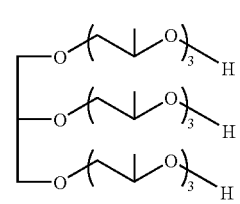

[2-1]

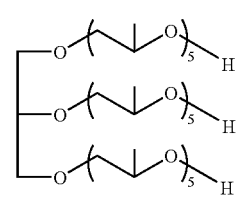

[2-2]

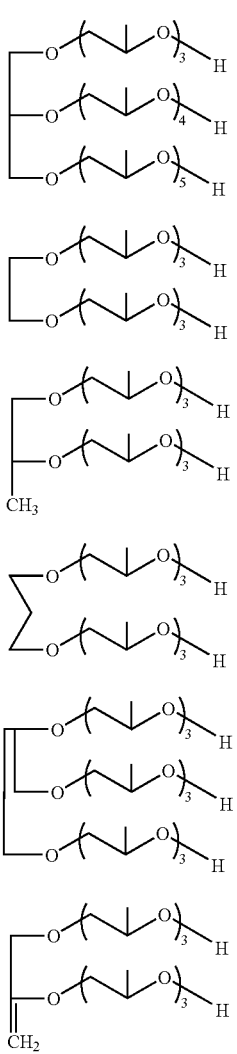

[Chemical Formula 21]

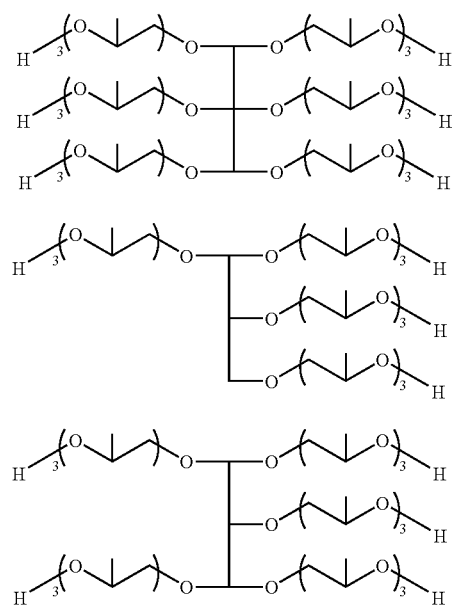

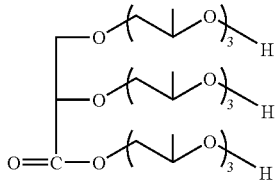

[Chemical Formula 22]

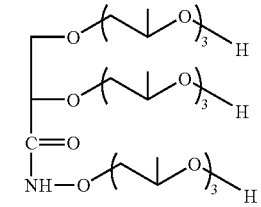

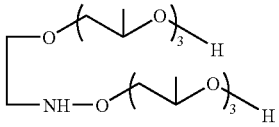

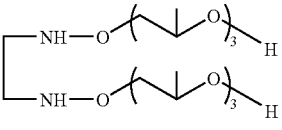

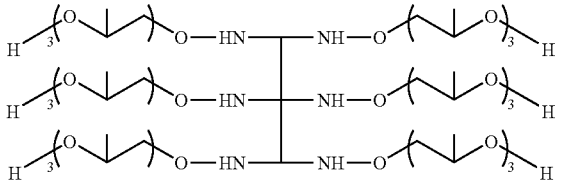

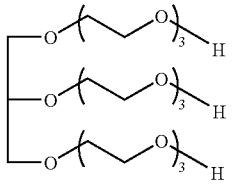

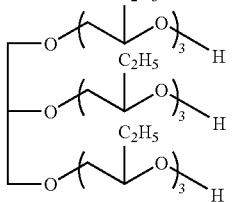

As $R_2$ in Formula (1), a divalent or trivalent hydrocarbon group corresponding to an ethyl group, an n-propyl group can be preferably used. Examples thereof include polyoxyethylene diol, polyoxypropylene diol, polyoxyethylene triol and polyoxypropylene triol, and the recurring number n of oxyalkylene is preferably 2 to 10.

As a polyglycidyl ether, for example there can be mentioned compounds represented by Formula (2).

In formula (2), $R_2$ represents the same group as that represented by $R_2$ in Formula (1). m is an integer of 2 to 6. The functional group $R_2$ represents a monovalent organic group.

However, the valence thereof can be changed in a range where hydrogen atoms contained in the organic group can be substituted with glycidyl ether groups, and is divalence, trivalence, tetravalence, pentavalence or hexavalence corresponding to the number m of glycidyl ether groups. A glycidyl ether compound in which m is 2 can be preferably used.

Examples of the polyglycidyl ether represented by Formula (2) include compounds represented by Formula [3-1] to Formula [3-6].

[Chemcial Formula 23]

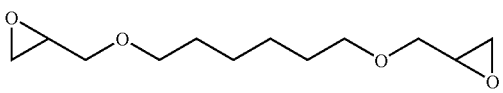

[3-1]

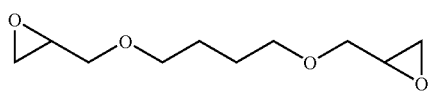

[3-2]

[3-3]

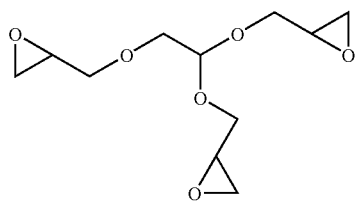

[3-4]

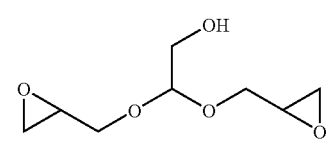

[3-5]

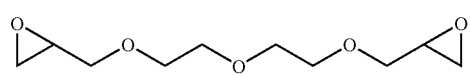

[3-6]

In the resist underlayer film forming composition of the present invention, a light absorbing compound (D), a surfactant, a rheology controlling agent and an adhesion aid can be contained.

The light absorbing compound (D) is not particularly limited so long as it has high absorptivity to light in a region of photosensitivity wavelength of photosensitive components in a photoresist layer provided on a resist underlayer film and can prevent a standing wave caused by reflection on a substrate and diffuse reflection due to an unevenness of the surface of a substrate.

Examples of such a light absorbing compound (D) include benzophenone compounds, benzotriazole compounds, azo compounds, naphthalene compounds, anthracene compounds, anthraquinone compounds, triazine compounds, triazine trione compounds and quinoline compounds. Naphthalene compounds, anthracene compounds, triazine compounds and triazine trione compounds are used. Then, also the light absorbing compound can be preferably reacted with the above component having epoxy groups and therefore, compounds having a carboxyl group or a phenolic hydroxide group are preferably used. Specific examples thereof include 1-naphthalene carboxylic acid, 2-naphthalene carboxylic acid, 1-naphthol, 2-naphthol, naphthyl acetic acid, 1-hydroxy-2-naphthalene carboxylic acid, 3-hydroxy-2-naphthalene carboxylic acid, 3,7-dihydroxy-2-naphthalene carboxylic acid, 6-bromo-2-hydroxy-naphthalene, 2,6-naphthalene dicarboxylic acid, 9-anthracene carboxylic acid, 10-bromo-9-anthracene carboxylic acid, anthracene-9,10-dicarboxylic acid, 1-anthracene carboxylic acid, 1-hydroxyanthracene, 1,2,3-anthracene-triol, 2,7,9-anthracene-triol, benzoic acid, 4-hydroxy benzoic acid, 4-bromo benzoic acid, 3-iodo benzoic acid, 2,4,6-tribromo phenol, 2,4,6-tribromo resorcinol, 3,4,5-triiodo benzoic acid, 2,4,6-triiodo-3-amino benzoic acid, 2,4,6-triiodo-3-hydroxy benzoic acid and 2,4,6-tribromo-3-hydroxy benzoic acid. Further, examples of the light absorbing compound include polymers having a unit structure represented by Formulae [4-1] to [4-3] and compounds represented by Formula [4-4]. In Formula [4-4], Ar represents a benzene ring, naphthalene ring or anthracene ring, and the rings may be substituted with an alkyl group having 1 to 5 carbon atom(s), an alkoxy group having 1 to 5 carbon atom(s), a fluorine atom, a chlorine atom, a bromine atom, an iodine atom, a nitro group, a cyano group, a hydroxyl group, a thiol group, a thioalkyl group having 1 to 5 carbon atom(s), a carboxyl group, a phenoxy group, an acetyl group, an alkoxycarbonyl group having 1 to 5 carbon atom(s) or a vinyl group.

[Chemical Formula 24]

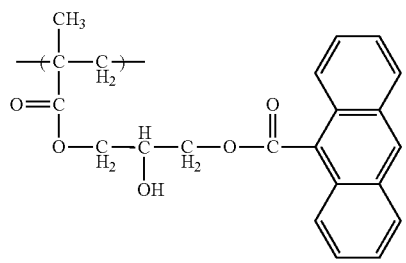

[4-1]

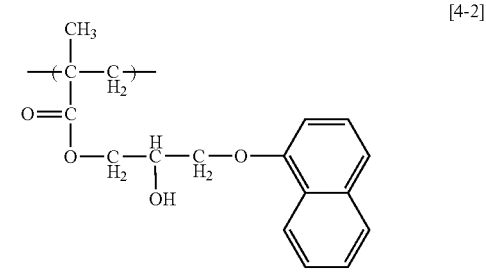

[4-2]

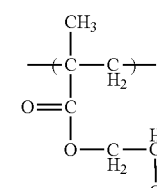 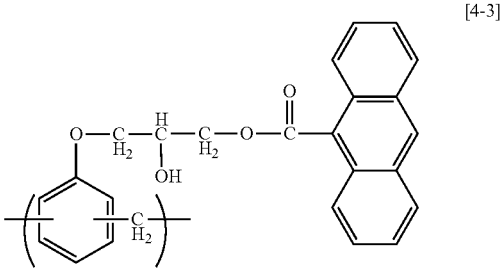

[4-3]

[4-4]

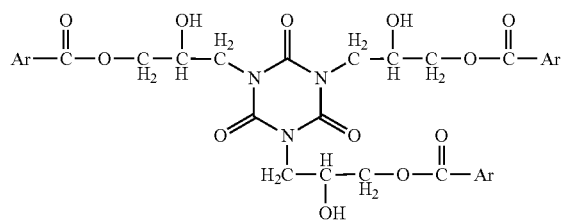

These light absorbing compounds can be used individually or in combination of two or more thereof. When the light absorbing compound is contained in the resist underlayer film forming composition of the present invention, the additive amount thereof is 30% by mass or less, for example 1 to 20% by mass, or 1 to 10% by mass, based on the mass of the solid content.

The resist underlayer film forming composition of the present invention may contain a surfactant. Examples of the surfactant include: nonionic surfactants, for example sorbitan fatty acid esters such as sorbitan monolaurate, sorbitan monopalmitate, sorbitan monostearate, sorbitan monooleate, sorbitan trioleate and sorbitan tristearate, polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate and polyoxyethylene sorbitan stearate; fluorine-based surfactants, for example EFTOP EF301, EF303 and EF352 (manufactured by Tohkem Products Co., Ltd.), MEGAFACE F171 and F173 (manufactured by DIC Corporation), Fluorad FC430 and FC431 (manufactured by Sumitomo 3M Limited), Asahi Guard AG710 and Surfron S-382, SC101, SC102, SC103, SC104, SC105 and SC106 (manufactured by Asahi Glass Co., Ltd.); and Organosiloxane polymer KP341 (manufactured by Shin-Etsu Chemical Co., Ltd.). The amount of the surfactant is usually 0.2% by mass or less, preferably 0.1% by mass or less, based on the mass of all components of the reflection preventing film-forming composition of the present invention. The surfactant may be incorporated individually or in combination of two or more types thereof.

In the resist underlayer film forming composition of the present invention, an acid generator can be contained for conforming the acidity of the resist underlayer film with that of the photoresist with which the resist underlayer film is coated during a lithography process. Examples of the acid generator include: organic sulfonic acid alkyl ester compounds such as benzoin tosylate and 2-nitrobenzyl tosylate; and onium salt compounds such as diphenyliodonium trifluoromethanesulfonate, diphenyliodonium dodecylbenzenesulfonate, bis(4-tert-butylphenyl)iodonium camphorsulfonate, bis(4-tert-butylphenyl)iodonium nonafluoro-n-butanesulfonate, bis(4-tert-butylphenyl)iodonium trifluoromethanesulfonate and triphenylsulfonium trifluoromethanesulfonate. Examples of the acid generator further include 2,4,4,6-tetrabromocyclohexanedienone, phenyl-bis(trichloromethyl)-s-triazine and N-hydroxysuccinimide trifluoromethanesulfonate. The acid generator is used if necessary, and the additive amount of the acid generator is usually 20% by mass or less, preferably 10% by mass or less, or 2% by mass or less, based on the mass of the solid content of the resist underlayer film forming composition of the present invention.

The resist underlayer film forming composition of the present invention may contain as others if necessary, a rheology controlling agent, an adhesion aid, etc.

Examples of the rheology controlling agent include dimethyl phthalate, diethyl phthalate, diisobutyl phthalate, dihexyl phthalate, butylisodecyl phthalate, di-n-butyl adipate, diisobutyl adipate, diisooctyl adipate, octyldecyl adipate, di-n-butyl maleate, diethyl maleate, dinonyl maleate, methyl oleate, butyl oleate, tetrahydrofurfuryl oleate, n-butyl stearate and glyceryl stearate. The rheology controlling agent is contained in an amount of usually less than 10% by mass, based on the mass of the solid content of the resist underlayer film forming composition of the present invention.

Examples of the adhesion aid include trimethylchlorosilane, dimethylvinylchlorosilane, methyldiphenylchlorosilane, chloromethyldimethylchlorosilane, trimethylmethoxysilane, dimethyldiethoxysilane, methyldimethoxysilane, dimethylvinylethoxysilane, γ-methacryloxypropyltrimethoxysilane, diphenyldimethoxysilane, phenyltriethoxylsilane, hexamethyldisilazane, N,N'-bis(trimethylsilyl)urea, dimethyltrimethylsilylamine, trimethylsilylimidazol, vinyltrichlorosilane, γ-chloropropyltrimethoxysilane, γ-aminopropyltriethoxysilane, γ-glycidoxypropyltrimethoxysilane, γ-methacryloxypropyltrimethoxysilane, benzotriazole, benzimidazole, indazole, imidazole, 2-mercaptobenzimidazole, 2-mercaptobenzothiazole, 2-mercaptobenzooxazole, urazole, thiouracil, mercaptoimidazole, mercaptopyrimidine, 1,1-dimethyl urea, 1,3-dimethyl urea and thiourea. The adhesion aid is contained in an amount of usually less than 2% by mass, based on the mass of the solid content of the resist underlayer film forming composition of the present invention.

In the resist underlayer film forming composition of the present invention, as a solvent (C) for dissolving the solid content, various solvents can be used. Examples thereof include ethylene glycol monomethyl ether, ethylene glycol monoethyl ether, methylcellosolve acetate, ethylcellosolve acetate, diethylene glycol monomethyl ether, diethylene glycol monoethyl ether, propylene glycol, propylene glycol monomethyl ether, propylene glycol monomethyl ether acetate, propylene glycol propyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, butyl lactate, N,N-dimethylformamide, N,N-dimethylacetoamide and N-methylpyrrolidone. These solvents may be used individually or in combination of two or more types thereof. Further, these solvents may be used with a high-boiling point solvent such as propylene glycol monobutyl ether and propylene glycol monobutyl ether acetate.

Hereinafter, the use of the resist underlayer film forming composition of the present invention is described.

The resist underlayer film is formed by coating a semiconductor substrate (for example, silicon/silicon dioxide coated substrate, silicon nitride substrate, glass substrate, ITO substrate, etc.) with the resist underlayer film forming composition of the present invention by an appropriate coating method such as spinner, coater etc. and by calcining the composition. The calcining conditions are appropriately selected from calcining temperatures of 80° C. to 250° C. and calcining times of 0.3 minutes to 60 minutes. Preferably, the calcining temperature is 130° C. to 250° C. and the calcining time is 0.5 minutes to 5 minutes. Here, the resist underlayer film has a thickness of, for example 0.01 to 3.0 µm, or for example 0.03 to 1.0 µm.

The resist underlayer film forming composition of the present invention contains, as described above the resin (A), the liquid additive (B) and the solvent (C).

The resin (A) contains a compound having a protected carboxyl group represented by Formula (3), a compound having a group reactable with a carboxyl group, or a compound having a protected carboxyl group represented by Formula (3) and a group reactable with a carboxyl group.

When the resist underlayer film forming composition is applied on a substrate, for example on a substrate having unevenness, a resist underlayer film is formed after evaporating a solvent. In the resist underlayer film, a liquid additive is contained. Since the liquid additive remains in a liquid state after the evaporation of the solvent, it easily flows into holes of the substrate and can fill the holes to planarize the substrate. Since the liquid additive has in the molecule thereof, a hydroxyl group or an epoxy group, it crosslinks with resin components easily, and can be polymerized. The liquid additive is fully solidified after it is filled in the holes.

When the composition containing the resin composition (A) is applied on a semiconductor substrate and the resist underlayer film is formed by a calcination, a protected carboxyl group represented by Formula (3) in the resin composition (A) is thermally decomposed to provide a carboxyl group. Then, the thus generated carboxyl group is reacted with the above group reactable with a carboxyl group such as an epoxy group, an oxetanyl group, an oxazoline group, an alkoxysilyl group, an aminomethylol group and an isocyanate group, during the calcination.

In addition, the carboxyl group in the resin composition (A) is reacted also with a hydroxyl group or an epoxy group of the liquid additive (B) to form a crosslinked structure. Thus, the carboxyl group generated by a thermal decomposition of a protected carboxyl group of the resin composition (A), a component having a group reactable with a carboxyl group in the resin composition (A) and the liquid additive (B) are reacted with each other to produce a polymer having a crosslinked structure.

Particularly, when a compound having two or more protected carboxyl groups represented by Formula (3) or two or more groups reactable with a carboxyl group are used, due to reaction between a carboxyl group and a group reactable with a carboxyl group, bondings between the compounds are generated continuously. Then, due to such continuous bondings between the compounds, the thus formed resist underlayer film becomes so strong that the solubility thereof in an organic solvent generally used in a photoresist composition applied on the resist underlayer film as an upper layer thereof becomes low. Examples of the organic solvent include ethylene glycol monomethyl ether, ethylcellosolve acetate, diethylene glycol monoethyl ether, propylene glycol, propylene glycol monomethyl ether, propylene glycol monomethyl ether acetate, propylene glycol propyl ether acetate, toluene, methyl ethyl ketone, cyclohexanone, ethyl 2-hydroxypropionate, ethyl 2-hydroxy-2-methylpropionate, ethyl ethoxyacetate, methyl pyruvate, ethyl lactate and butyl lactate. Therefore, the resist underlayer film formed from the resist underlayer film forming composition of the present invention causes no intermixing with the photoresist. In addition, it is considered that when a compound having various reaction sites is used, the formed resist underlayer film becomes stronger. Particularly, it is considered that when a polymer having a protected carboxyl group represented by Formula (3) or a group reactable with a carboxyl group is used, a crosslinked structure is formed by a reaction in the calcination, so that the resist underlayer film becomes stronger.

In addition, the generation of a carboxyl group by a thermal decomposition of the protected carboxyl group represented by Formula (3) and the reaction of the thus generated carboxyl group with an epoxy group, a hydroxyl group, an oxetanyl group, an oxazoline group, an alkoxysilyl group, an aminomethylol group and an isocyanate are easily progressed under a calcination condition, so that they need no catalyst. Therefore, the resist underlayer film forming composition of the present invention does not need a strong acid such as sulfonic acid compounds which has been frequently used as a crosslinking catalyst in a composition for forming a conventional crosslinkable underlayer film. Further, since the system in which the resist underlayer film forming composition of the present invention forms a crosslinked structure by a reaction of polymers with each other, docs not contain low molecule compounds such as a low molecule crosslinker and a sulfonic acid compound which have been conventionally frequently used, the amount of sublimates generated during the calcination can be reduced and the contamination of a semiconductor substrate or a clean room by particles or foreign matters derived from the sublimate can be avoided.

Next, on the resist underlayer film, a photoresist layer is formed. The formation of the photoresist layer can be performed by a known method, that is, by applying a photoresist composition solution on an underlayer film and by calcining the composition.

The photoresist applied and formed on the resist underlayer film of the present invention is not particularly limited so long as it is exposed to exposure light, and both of a negative-type photoresist and a positive-type photoresist can be used. Examples of the photoresist include: a positive-type photoresist containing a novolac resin and 1,2-naphthoquinonediazide sulfonate ester; a chemical amplification type photoresist containing a binder having a group elevating alkali dissolving rate by being decomposed by an acid, and a photoacid generator; a chemical amplification type photoresist containing a low molecule compound elevating alkali dissolving rate of a photoresist by being decomposed by an acid, an alkali-soluble binder and a photoacid generator; and a chemical amplification type photoresist containing a binder having a group elevating alkali dissolving rate by being decomposed by an acid, a low molecule compound elevating alkali dissolving rate of a photoresist by being decomposed by an acid and a photoacid generator. Specific examples thereof include trade name: APEX-E manufactured by Shipley Company L.L.C., trade name: PAR710 manufactured by Sumitomo Chemical Co., Ltd. and trade name: SEPR430 manufactured by Shin-Etsu Chemical Co., Ltd.

Next, the exposure is performed through a predetermined mask. For the exposure, a KrF excimer laser (wavelength: 248 nm), an ArF excimer laser (wavelength: 193 nm) and a F2 excimer laser (wavelength: 157 nm) can be used. After the exposure, if necessary, post exposure bake (PEB) can be performed. The conditions of the PEB are appropriately selected from heating temperatures of 70° C. to 150° C. and heating times of 0.3 minutes to 10 minutes.

Next, development is performed with a developer for photoresist Consequently, for example when a positive-type photoresist is used, a photoresist of an exposed part is removed to form a photoresist pattern.

Examples of the developer for photoresist include aqueous solutions of alkali metal oxides such as potassium oxide and sodium oxide, aqueous solutions of quaternary ammonium hydroxides such as tetramethylammonium hydroxide, tetramethylammonium hydroxide and choline, and alkaline aqueous solutions such as solutions of amines such as ethanolamine, propylamine and ethylenediamine. Further, to these developers, a surfactant may be contained. The conditions for the development are appropriately selected from temperatures of 5° C. to 50° C. and times of 10 seconds to 300 seconds.

Then, using the thus formed pattern of the photoresist as a protecting film, the removal of the resist underlayer film and the processing of the semiconductor substrate are performed. The removal of the resist underlayer film is performed using gases such as tetrafluoromethane, perfluorocyclobutane ($C_4F_8$), perfluoropropane ($C_3F_8$), trifluoromethane, carbon monoxide, argon, oxygen, nitrogen, sulfur hexafluoride, difluoromethane, nitrogen trifluoride and chlorine trifluoride.

Before or after the resist underlayer film of the present invention is formed on a semiconductor substrate, an organic reflection preventing film layer may be applied and formed. The reflection preventing film composition used there is not particularly limited and can be arbitrary selected from those which have been conventionally used in a lithography process. The reflection preventing film can be formed by a conventionally used method such as applying by spinner or coater and calcining. Examples of the reflection preventing film composition include: those containing mainly light absorbing compounds, polymers and solvents; those containing mainly polymers having a light absorbing group linked by a chemical bond, crosslinkers and solvents; those containing mainly light absorbing compounds, crosslinkers and solvents; and those containing mainly polymer crosslinkers having light absorptivity and solvents. These reflection preventing film compositions may contain also, if necessary acid components, acid generator components, rheology controlling agents. The light absorbing compound is not particularly limited to be used so long as it has high absorptivity to light in a photosensitivity wavelength region of photosensitive components in a photoresist provided on a reflection preventing film and examples thereof include benzophenone compounds, benzotriazole compounds, azo compounds, naphthalene compounds, anthracene compounds, anthraquinone compounds and triazine compounds. Examples of the polymer include polyesters, polyimides, polystyrenes, novolac resins, polyacetals and acrylic polymers. Examples of the polymer having a light absorbing group linked by a chemical bond include polymers having a light absorbing aromatic ring structure such as an anthracene ring, a naphthalene ring, a benzene ring, a quinoline ring, a quinoxaline ring and a thiazole ring.

Further, the semiconductor substrate on which the resist underlayer film forming composition of the present invention is applied may be that having an inorganic reflection preventing film formed by a CVD method on the surface thereof, and thereon, the resist underlayer film of the present invention can be formed.

The resist underlayer film formed from the resist underlayer film forming composition of the present invention may absorb exposure light used in a lithography process depending on the wavelength of the exposure light, and in such a case, the resist underlayer film can be used as a layer having an effect of preventing a reflecting light at the substrate, that is as a reflection preventing film.

When the resist underlayer film is used as a reflection preventing film in a lithography process using a KrF excimer laser (wavelength: 248 nm), the solid content of the resist underlayer film forming composition contains preferably components having an anthracene ring or a naphthalene ring. In addition, when the resist underlayer film is used as a reflection preventing film in a lithography process using an ArF excimer laser (wavelength: 193 nm), the solid content of the resist underlayer film forming composition contains preferably compounds having a benzene ring. Further, when the resist underlayer film is used as a reflection preventing film in a lithography process using an F2 excimer laser (wavelength: 157 nm), the solid content of the resist underlayer film forming composition contains preferably compounds having a bromine atom or an iodine atom.

Further, the resist underlayer film of the present invention can be used as a layer for preventing an interaction between the substrate and the photoresist, a layer having a function of preventing a harmful action of substances, generated during the exposure of materials used in the photoresist or of the photoresist to light, against the substrate, a layer having a function of preventing diffusion or harmful action of substances, generated from the substrate during the heating calcination, to or against the upper layer photoresist, and a barrier layer for reducing a poisoning effect of a dielectric layer formed on a semiconductor substrate against the photoresist layer.

In addition, the resist underlayer film formed from the resist underlayer film forming composition is applied to a substrate provided with a via hole which is used in a dual damascene process and can be used as a filling material capable of filling the hole without a void or can be also used as a planarizing material for planarizing the substrate surface.

Hereinafter, the present invention will be more specifically described referring to Examples which should not be construed as limiting the scope of the present invention.

EXAMPLES

Synthesis Example 1

In 80.0 g of propylene glycol monomethyl ether acetate, 9.00 g of 1-butoxyethyl methacrylate (manufactured by Honshu Chemical Industry Co., Ltd.), 6.87 g of glycidyl methacrylate, 2.74 g of γ-butyrolactone methacrylate and 4.16 g of methyl acrylate were dissolved and nitrogen was flowed into the resultant solution for 30 minutes, followed by elevating the temperature of the solution to 65° C. While maintaining the reaction solution at 65° C., 0.37 g of azobisisobutyronitrile and 0.37 g of 1-dodecanethiol were added thereto. In a nitrogen atmosphere, the reaction mixture was stirred at 65° C. for 24 hours and 0.1 g of di-tert-butyl-p-cresol was added thereto to thereby obtain a solution of a quarterpolymer (Formula [1-33]). The obtained copolymer was subjected to a GPC analysis and was found to have a number average molecular mass Mn of 5,900, a mass average molecular mass (converted into that of standard polystyrene) Mw of 9,900.

Synthesis Example 2

In 80.0 g of propylene glycol monomethyl ether acetate, 9.00 g of 1-butoxyethyl methacrylate (manufactured by Honshu Chemical Industry Co., Ltd.), 7.85 g of glycidyl methacrylate, 2.35 g of γ-butyrolactone methacrylate and 3.19 g of benzyl methacrylate were dissolved and nitrogen was flowed into the resultant solution for 30 minutes, followed by elevating the temperature of the solution to 65° C. While maintaining the reaction solution at 65° C., 0.38 g of azobisisobutyronitrile and 0.38 g of 1-dodecanethiol were added thereto. In a nitrogen atmosphere, the reaction mixture was stirred at 65° C. for 24 hours and 0.1 g of 4-methoxyphenol was added thereto to thereby obtain a solution of a quarterpolymer (Formula [1-34]). The obtained copolymer was subjected to a GPC analysis and was found to have a number average molecular mass Mn of 6,500, a mass average molecular mass (converted into that of standard polystyrene) Mw of 10,000.

Example 1

To 10.0 g of a solution (solid content concentration: 20.0%) containing a copolymer obtained in Synthesis Example 1, 0.10 g of a compound represented by Formula [3-6] (trade name: Denacor 850L; manufactured by Nagase Cumtex Co., Ltd.) as a liquid additive was added and 0.75 g of propylene glycol monomethyl ether acetate and 2.03 g of ethyl lactate as solvents were added to prepare a 14% solution. Thereafter, the solution was filtered using a polyethylene-made microfilter having a pore diameter of 0.05 μm to prepare a solution of a resist underlayer film forming composition.

Example 2

To 10.0 g of a solution (solid content concentration: 20.0%) containing a copolymer obtained in Synthesis Example 2, 0.05 g of a compound represented by Formula [2-1] (trade name: Sannix GP-600; manufactured by Sanyo Chemical Industries, Ltd.) as a liquid additive was added and 1.35 g of propylene glycol monomethyl ether acetate and 3.97 g of ethyl lactate as solvents were added to prepare a 13.5% solution. Thereafter, the solution was filtered using a polyethylene-made micro-filter having a pore diameter of 0.05 μm to prepare a solution of a resist underlayer film forming composition.

Comparative Example 1

To 10.0 g of a solution (solid content concentration: 20.0%) containing a copolymer obtained in Synthesis Example 1, 0.75 g of propylene glycol monomethyl ether acetate and 2.03 g of ethyl lactate as solvents were added to prepare a 14% solution. Thereafter, the solution was filtered using a polyethylene-made microfilter having a pore diameter of 0.05 μm to prepare a solution of a resist underlayer film forming composition.

Comparative Example 2

To 10.0 g of a solution (solid content concentration: 20.0%) containing a copolymer obtained in Synthesis Example 2, 1.35 g of propylene glycol monomethyl ether acetate and 3.97 g of ethyl lactate as solvents were added to prepare a 13.5% solution. Thereafter, the solution was filtered using a polyethylene-made microfilter having a pore diameter of 0.05 μm to prepare a solution of a resist underlayer film forming composition.

Dissolution Test in Photoresist Solvent

The solutions of resist underlayer film forming compositions obtained in Examples 1 and 2 and Comparative Examples 1 and 2 were applied on a silicon wafer by a spinner. The composition was heated on a hot plate at 205° C. for 1 minute to form a resist underlayer film (having a film thickness of 0.30 μm). The resist underlayer film was immersed in a solvent used for the photoresist such as ethyl lactate, propylene glycol monomethyl ether acetate and propylene glycol monomethyl ether and was confirmed to be insoluble in the solvent.

Test for Intermixing with Photoresist

The solutions of resist underlayer film forming compositions obtained in Examples 1 and 2 and Comparative Examples 1 and 2 were applied on a silicon wafer by a spinner. The composition was heated on a hot plate at 205° C. for 1 minute to form a resist underlayer film (having a film thickness of 0.30 μm), On the resist underlayer film, as an upper layer thereof, a commercially available photoresist solution (trade name: GARS8105G1; manufactured by Fuji Photo Film Co., Ltd., and trade name: SEPR430; manufactured by Shin-Etsu Chemical Co., Ltd.) was applied by a spinner. The composition was heated on a hot plate at 90° C. or 110° C. for 1.5 minutes. After exposing the photoresist to light, post exposure bake was performed at 90° C. for 1.5 minutes. After developing the photoresist, the film thickness of the photoresist underlayer film was measured to confirm that the intermixing of the resist underlayer film with the photoresist layer is not caused.

Test for Planarized Ratio and Filling Property

The solutions of resist underlayer film forming compositions obtained in Examples 1 and 2 and Comparative Examples 1 and 2 were applied on a $SiO_2$ wafer substrate having holes (having a diameter of 0.11 μm and a depth of 0.70 μm) by a spinner. The adopted substrate is a $SiO_2$ wafer substrate having a Dense pattern of holes as shown in FIG. 1. The Dense pattern is a pattern in which the interval from the center of a hole to the center of an adjacent hole is one time the diameter of the hole. The Dense pattern is a 1 cm square and the interval of Dense patterns is 0.6 mm. After the application, the composition was heated on a hot plate at 205° C. for 1 minute to form a resist underlayer film. The film thickness was measured and found to be 0.30 μm in an open area in the vicinity of which no hole pattern exists. With a scanning electronic microscope (SEM), the planarizing property of the resist underlayer film was evaluated by observing the cross-section form of a $SiO_2$ wafer substrate having holes on which the resist underlayer film forming composition obtained in Examples 1 or 2 or Comparative Examples 1 or 2 was applied.

In Table 1, the film thicknesses of the Dense part and the open area were measured and the difference (Bias) therebetween wets measured to evaluate the planarizing property.

Further, inside holes, voids (gaps) were not observed and it was observed that the inside of holes is filled with the resist underlayer film.

TABLE 1

|  | Film thickness (nm) | |
| --- | --- | --- |
|  | Dense | Bias |
| Example 1 | 160 | 140 |
| Example 2 | 140 | 160 |
| Comparative Example 1 | 110 | 190 |
| Comparative Example 2 | 110 | 190 |

The film thickness difference (Bias) of the resist underlayer films of Examples 1 and 2 between the film thickness on the Dense pattern and the film thickness of the open area in the vicinity of which no hole pattern exists was smaller than the difference of Comparative Examples 1 and 2. This is considered to be because by adding a liquid resin to a solid resin, the solution of the resist underlayer film forming composition flowed smoothly into the hole and the reflow property thereof during heating was enhanced.

Measurement of Optical Parameters

The solution of resist underlayer film forming composition prepared in Example 1 was applied on a silicon wafer by a spinner. The composition was calcined on a hot plate at 205° C. for 1 minute to form an underlayer (thickness: 0.20 μm). Then, the refractive index (n value) and the attenuation coefficient (k value) at a wavelength of 193 nm of this reflection preventing film were measured using a spectro-elipsometer and were found to be 1.65 and 0.00 respectively.

Test for Dry Etching Rate

The solutions of resist underlayer film forming compositions obtained in Examples 1 and 2 and Comparative Examples 1 and 2 were applied on a silicon wafer by a spinner. The composition was heated on a hot plate at 205° C. for 1 minute to form an underlayer film for lithography (having a film thickness of 0.30 μm). Then, the dry etching rate of the underlayer film was measured using RIE system ES401 (manufactured by Nippon Scientific Co., Ltd.) under a condition where $CF_4$ was used as a dry-etching gas.

The result thereof is shown in Table 2. The dry-etching selectivity is expressed in the dry etching rate of the resist underlayer film when the dry etching rate of a photoresist for KrF laser lithography (trade name: SEPR430; manufactured by Shin-Etsu Chemical Co., Ltd.) is assumed to be 1.00.

TABLE 2

|  | Dry-etching selectivity |
|---|---|
| Example 1 | 1.70 |
| Example 2 | 1.55 |
| Comparative Example 1 | 1.65 |
| Comparative Example 2 | 1.50 |

It is apparent that the etching rate of the resist underlayer film obtained from the resist underlayer film forming composition in Examples 1 and 2 is larger than that of the resist underlayer film obtained from the resist underlayer film forming composition in Comparative Examples 1 and 2.

The dry etching rate of the resist underlayer film needs to be higher than that of the photoresist because in the process of developing the photoresist formed on the resist underlayer film and of exposing the underlayer substrate by dry-etching thereafter, with the dry etching rate of the resist underlayer film higher than that of the photoresist, the resist underlayer film is removed before the photoresist is scraped away. Accordingly, the pattern of the developed photoresist can be accurately transferred to the substrate.

Though when a planarizing film or an underlayer reflection preventing film is the resist underlayer film, the etching rate of the resist underlayer film is preferably higher than that of the resist film, it is desired that the etching rate of the resist underlayer film is varied depending on the type of the resist film, therefore, in the present invention, by containing a liquid additive (B) in the composition, the etching rate can be controlled.

BRIEF DESCRIPTION OF THE DRAWINGS

FIG. 1 is a sectional view of a state in which a resist underlayer film is formed on a substrate having holes.

DESCRIPTION OF THE REFERENCE NUMERALS a Bias (the film thickness difference between the Dense part and the open area)
b the original depth of a hole in a used substrate
c the resist underlayer film (gap filling material) of the present invention
d the base substrate

The invention claimed is:

1. A resist underlayer film forming composition comprising:

a resin (A);
a liquid additive (B) being liquid at a temperature from 20° C. to about 270° C.; and
a solvent (C),
wherein
the resin (A) is a compound having a protected carboxyl group and a compound having a group reactable with a carboxyl group, or a compound having a protected carboxyl group and a group reactable with a carboxyl group, and
the liquid additive (B) is a polyether polyol represented by Formula (1):

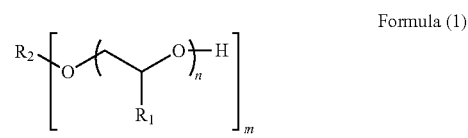

Formula (1)

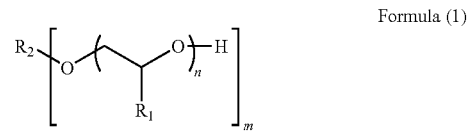

Formula (1)

where:
n represents an integer of 1 to 300;
m represents an integer of 2 to 6;
$R_1$ represents a hydrogen atom or an alkyl group having 1 to 10 carbon atom(s); and
$R_2$ represents an alkyl group having 1 to 10 carbon atoms, an alkenyl group having 2 to 6 carbon atoms, an alkynyl group having 2 to 10 carbon atoms, an alkylcarbonyl group having 2 to 10 carbon atoms, an alkylcarbonylamino group having 2 to 10 carbon atoms, an alkyloxyalkyl group having 2 to 10 carbon atoms, an alkylamino group having 1 to 10 carbon atoms, an alkyldiamino group having 1 to 10 carbon atoms, or a combination thereof, $R_2$ being an organic group capable of having a valence number of 2 to 6 according to the number m of polyoxyalkylene groups.

2. The resist underlayer film forming composition according to claim 1, further comprising a light absorbing compound (D).

3. A method of forming a resist underlayer film used in a lithography process for production of a semiconductor device, the method comprising:
applying the resist underlayer film forming composition according to claim 1 on a substrate and
subjecting the composition to a temperature from 80° C. to 250° C.

4. A method of manufacturing a semiconductor device, the method comprising:
forming a resist underlayer film by applying the resist underlayer film forming composition according to claim 1 on a semiconductor substrate and by subjecting the composition to a temperature from 80° C. to 250° C.;
forming a photoresist layer on the underlayer film;
exposing the semiconductor substrate coated with the resist underlayer film and the photoresist layer to light; and
developing the photoresist layer after the exposure to light.

5. A method of manufacturing a semiconductor device, the method comprising:
   forming a resist underlayer film by applying a resist underlayer film forming composition on a semiconductor substrate and by subjecting the composition to a temperature from 80° C. to 250° C.;
   forming a photoresist layer on the underlayer film;
   exposing the semiconductor substrate coated with the resist underlayer film and the photoresist layer to light; and
   developing the photoresist layer after the exposure to light, wherein
      the resist underlayer film forming composition comprises:
         a resin (A);
         a liquid additive (B) being liquid at a temperature from 20° C. to about 270° C.; and
         a solvent (C), and
      the liquid additive (B) comprises a polyether polyol represented by Formula (1):

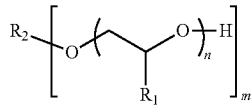

Formula (1)

where:
   n represents an integer of 1 to 300;
   m represents an integer of 2 to 6;
   $R_1$ represents a hydrogen atom or an alkyl group having 1 to 10 carbon atom(s); and
   $R_2$ represents an alkyl group having 1 to 10 carbon atoms, an alkenyl group having 2 to 6 carbon atoms, an alkynyl group having 2 to 10 carbon atoms, an alkylcarbonyl group having 2 to 10 carbon atoms, an alkylcarbonylamino group having 2 to 10 carbon atoms, an alkyloxyalkyl group having 2 to 10 carbon atoms, an alkylamino group having 1 to 10 carbon atoms, an alkyldiamino group having 1 to 10 carbon atoms, or a combination thereof, $R_2$ being an organic group capable of having a valence number of 2 to 6 according to the number m of polyoxyalkylene groups.

* * * * *